(12) United States Patent
Mori et al.

(10) Patent No.: US 11,024,376 B2
(45) Date of Patent: Jun. 1, 2021

(54) MEMORY APPARATUS AND METHOD OF CONTROLLING MEMORY APPARATUS

(71) Applicant: SONY SEMICONDUCTOR SOLUTIONS CORPORATION, Kanagawa (JP)

(72) Inventors: Yotaro Mori, Kanagawa (JP); Makoto Kitagawa, Kanagawa (JP); Jun Okuno, Kanagawa (JP); Haruhiko Terada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/612,458

(22) PCT Filed: May 11, 2018

(86) PCT No.: PCT/JP2018/018251
§ 371 (c)(1),
(2) Date: Nov. 11, 2019

(87) PCT Pub. No.: WO2018/212082
PCT Pub. Date: Nov. 22, 2018

(65) Prior Publication Data
US 2020/0098425 A1      Mar. 26, 2020

(30) Foreign Application Priority Data

May 19, 2017 (JP) .............................. JP2017-099626

(51) Int. Cl.
*G11C 11/00*     (2006.01)
*G11C 13/00*     (2006.01)

(52) U.S. Cl.
CPC ........ *G11C 13/004* (2013.01); *G11C 13/0038* (2013.01); *G11C 13/0069* (2013.01); *G11C 13/0097* (2013.01); *G11C 2013/0045* (2013.01)

(58) Field of Classification Search
CPC .............. G11C 13/004; G11C 13/0038; G11C 13/0069; G11C 13/0097; G11C 2013/0045
(Continued)

(56) References Cited

U.S. PATENT DOCUMENTS 7,466,584 B1 * 12/2008 Parkinson ................ G11C 8/10
365/148
8,144,499 B2 * 3/2012 Kitagawa ........... G11C 13/0064
365/148
(Continued)

FOREIGN PATENT DOCUMENTS

CN       101840731 A      9/2010
CN       103680617 A      3/2014
(Continued)

OTHER PUBLICATIONS

International Search Report and Written Opinion of PCT Application No. PCT/JP2018/018251, dated Jul. 17, 2018, 08 pages of ISRWO.

*Primary Examiner* — Viet Q Nguyen
(74) *Attorney, Agent, or Firm* — Chip Law Group

(57) ABSTRACT

A memory apparatus includes a memory cell disposed at an intersection of a first wiring line and a second wiring line, and including a variable resistor and a selector, the variable resistor having a resistance state that changes to a first resistance state and a second resistance state, and a drive circuit that writes data to the memory cell by changing the variable resistor from the first resistance state to the second resistance state, and erases the data stored in the memory cell by changing the variable resistor from the second
(Continued)

resistance state to the first resistance state. When erasing the data, the drive circuit changing in a stepwise manner a voltage applied to the memory cell, and changing in a stepwise manner a current limit value that limits a magnitude of a current flowing through the memory cell.

10 Claims, 13 Drawing Sheets

(58) Field of Classification Search
 USPC .................................................. 365/148, 218
 See application file for complete search history.

(56) References Cited

U.S. PATENT DOCUMENTS

| | | | | |
|---|---|---|---|---|
| 8,345,472 B2* | 1/2013 | Lee | ..................... | H01L 27/2436 365/163 |
| 8,817,525 B2* | 8/2014 | Ishihara | ............. | G11C 13/0007 365/148 |
| 8,995,167 B1* | 3/2015 | Kim | .................. | G11C 13/0069 365/148 |
| 10,002,665 B1* | 6/2018 | Bhargava | ............. | G11C 13/003 |
| 10,186,658 B2* | 1/2019 | Nonoguchi | ........... | H01L 45/085 |
| 10,418,416 B2* | 9/2019 | Sei | ........................ | H01L 45/142 |
| 10,706,925 B2* | 7/2020 | Mori | .................. | G11C 13/0061 |
| 2007/0070682 A1* | 3/2007 | Nakashima | ........ | G11C 13/0007 365/148 |
| 2008/0130391 A1* | 6/2008 | Terzioglu | ............. | G11C 29/026 365/210.11 |
| 2008/0219040 A1* | 9/2008 | Philipp | .............. | G11C 16/3468 365/148 |
| 2009/0147565 A1* | 6/2009 | Lowrey | ............... | G11C 11/5678 365/163 |
| 2009/0244953 A1* | 10/2009 | Maejima | ............. | G11C 13/0069 365/148 |
| 2009/0285007 A1* | 11/2009 | Majewski | .......... | G11C 13/0069 365/148 |
| 2010/0232207 A1 | 9/2010 | Maejima et al. | | |
| 2011/0051493 A1* | 3/2011 | Baba | ................... | G11C 13/0002 365/148 |
| 2011/0216574 A1* | 9/2011 | Ichihara | .................. | G11C 11/00 365/148 |
| 2012/0075911 A1* | 3/2012 | Nakura | ............... | G11C 13/0028 365/148 |
| 2012/0127779 A1* | 5/2012 | Scheuerlein | ....... | G11C 13/0007 365/148 |
| 2012/0140544 A1* | 6/2012 | Kim | .................... | G11C 13/0064 365/148 |
| 2012/0236624 A1* | 9/2012 | Costa | .................. | G11C 11/5664 365/148 |
| 2014/0029330 A1* | 1/2014 | Muraoka | ................. | H01L 45/04 365/148 |
| 2014/0036573 A1* | 2/2014 | Ishihara | ............. | G11C 13/0021 365/148 |
| 2014/0071734 A1* | 3/2014 | Sugimae | ............... | G11C 13/004 365/148 |
| 2014/0203235 A1* | 7/2014 | Lee | ................... | H01L 29/66969 257/3 |
| 2015/0023089 A1* | 1/2015 | Kolluri | .............. | G11C 13/0069 365/148 |
| 2016/0019959 A1* | 1/2016 | Takagi | ............... | G11C 13/0069 365/148 |
| 2016/0247562 A1* | 8/2016 | Tortorelli | ........... | G11C 13/0004 |
| 2017/0309335 A1 | 10/2017 | Mori et al. | | |

FOREIGN PATENT DOCUMENTS

| | | |
|---|---|---|
| CN | 107148651 A | 9/2017 |
| JP | 2010-211895 A | 9/2010 |
| JP | 2011-243265 A | 12/2011 |
| JP | 2014-075170 A | 4/2014 |
| KR | 10-2010-0103372 A | 9/2010 |
| KR | 10-2017-0082518 A | 7/2017 |
| TW | 201044403 A | 12/2010 |
| TW | 201411623 A | 3/2014 |
| TW | 201621914 A | 6/2016 |
| WO | 2016/072173 A1 | 5/2016 |

* cited by examiner

[ FIG. 1 ]
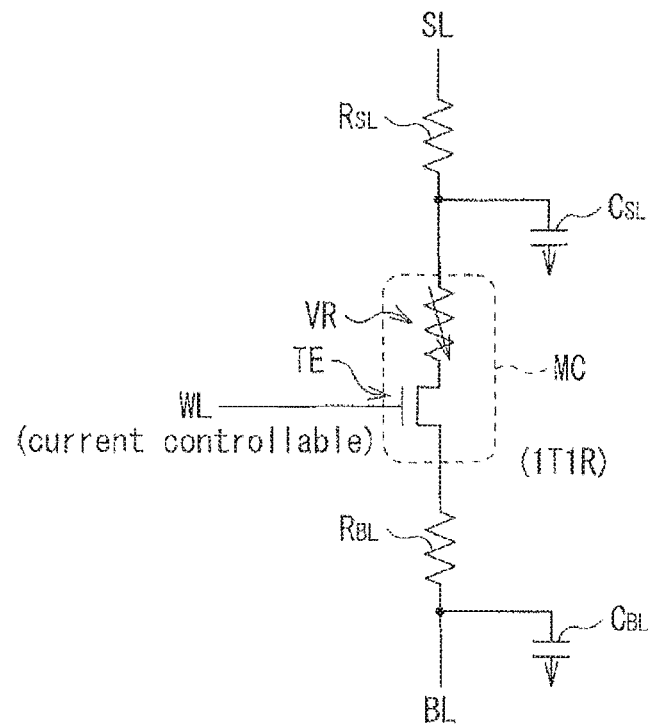
[ FIG. 2 ]
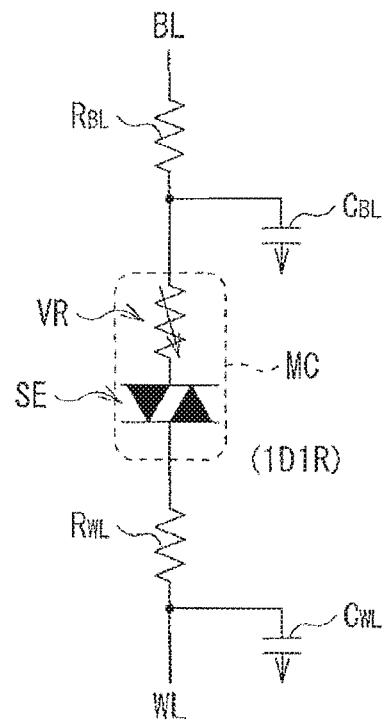

[ FIG. 3 ]
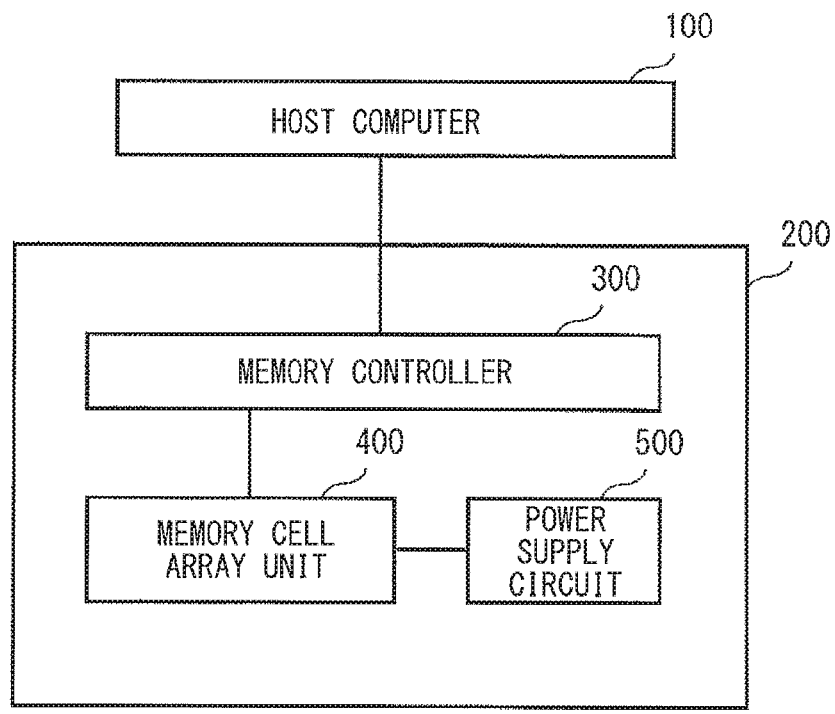
[ FIG. 4 ]
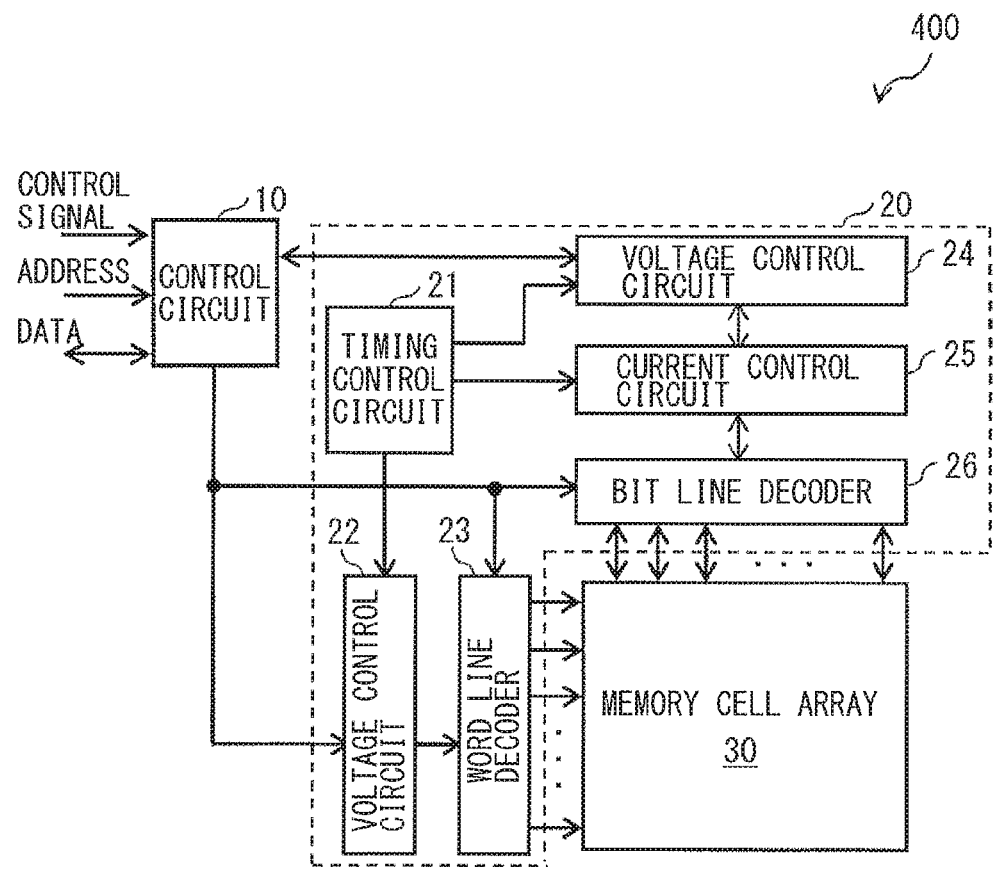

[ FIG. 5 ]
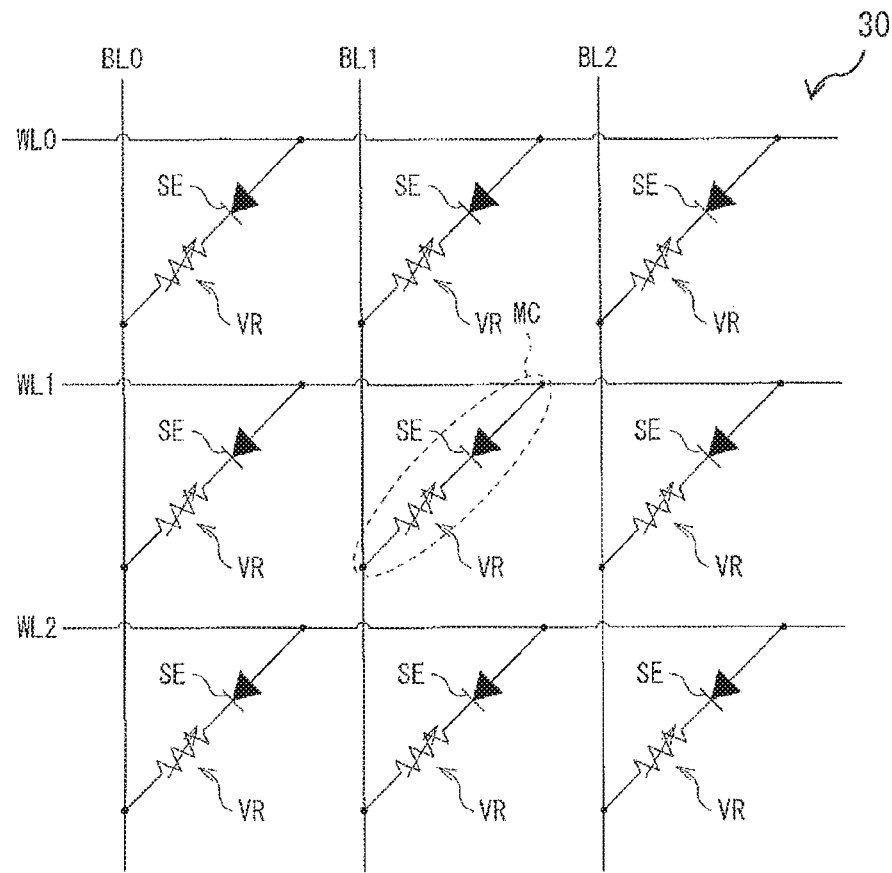
[ FIG. 6 ]
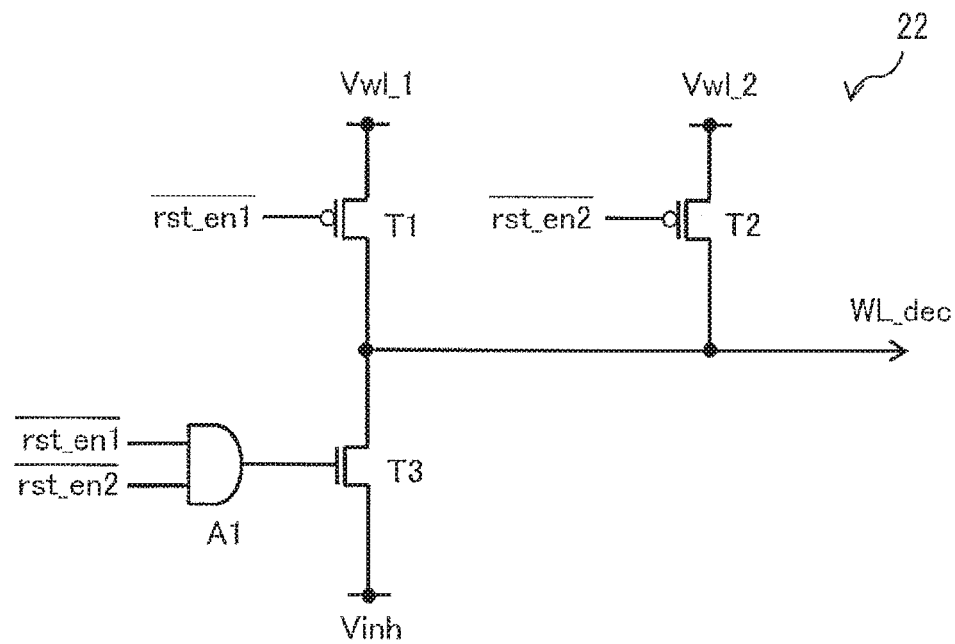

[ FIG. 7 ]
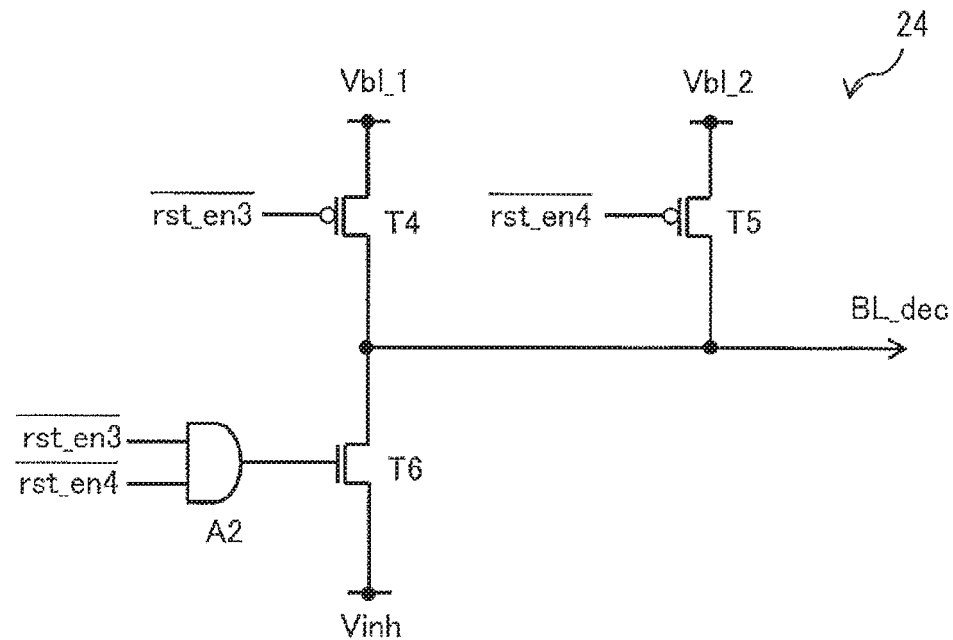
[ FIG. 8 ]
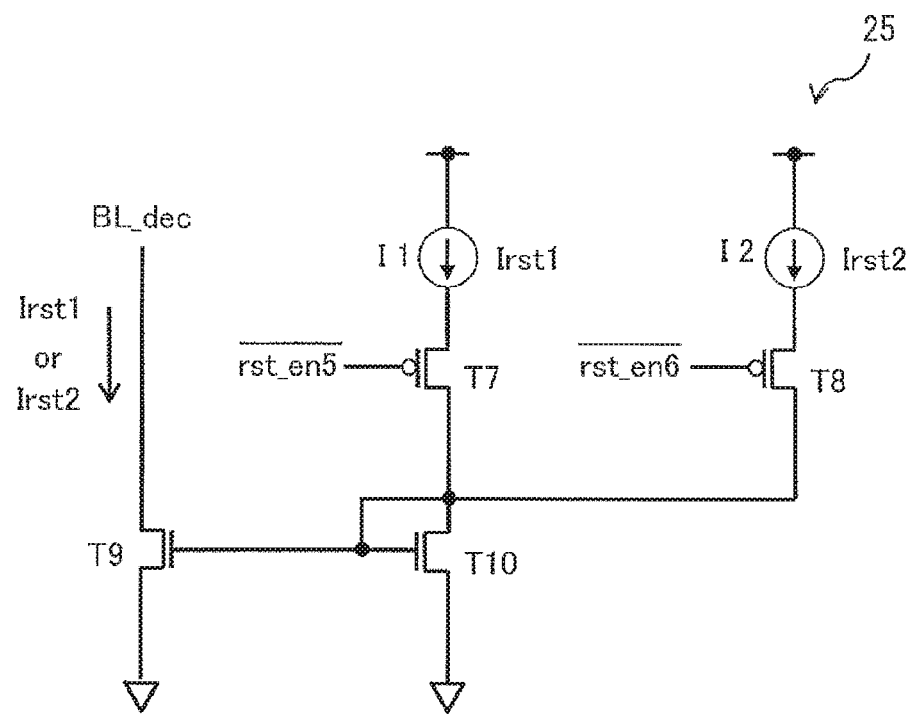

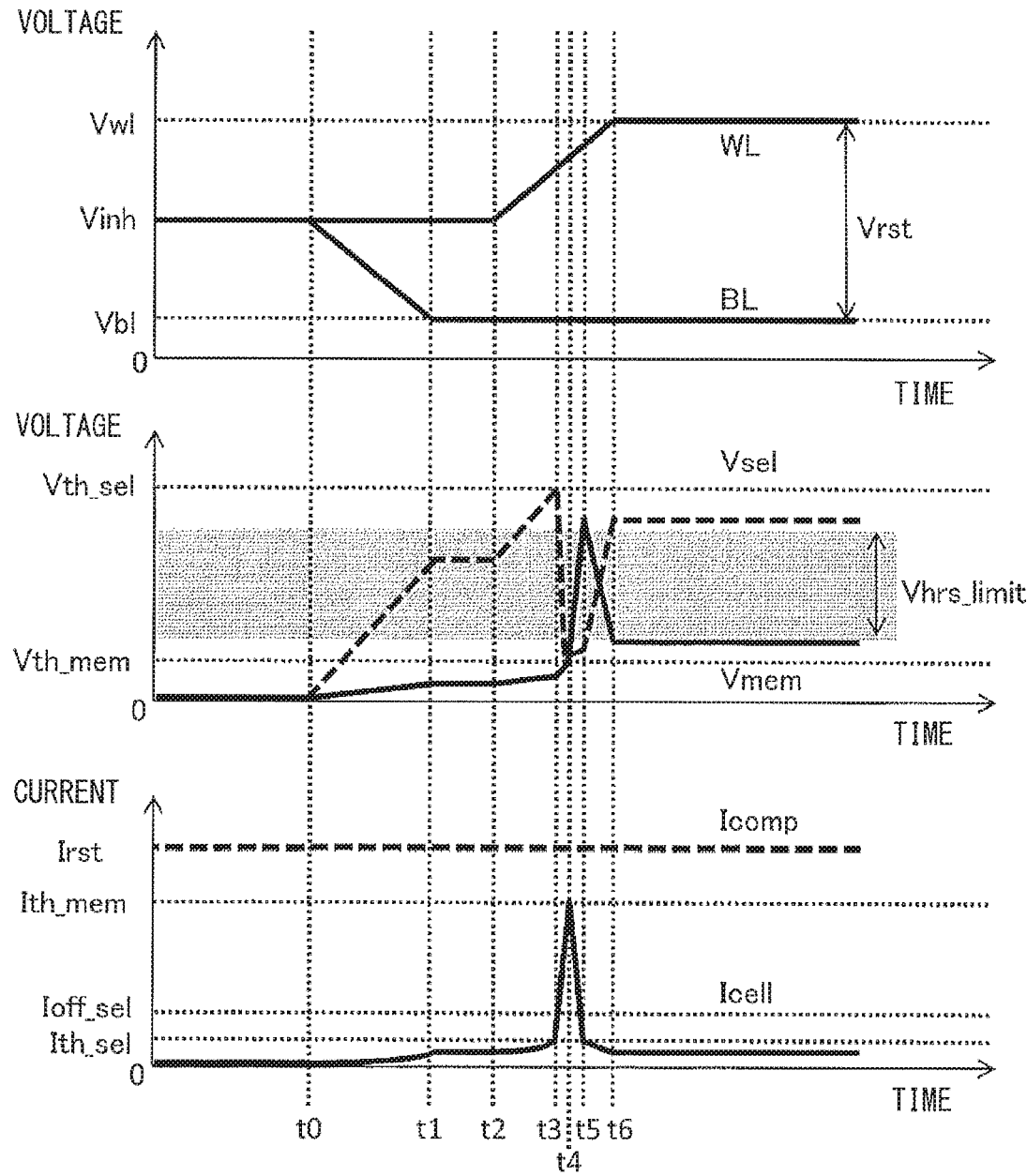

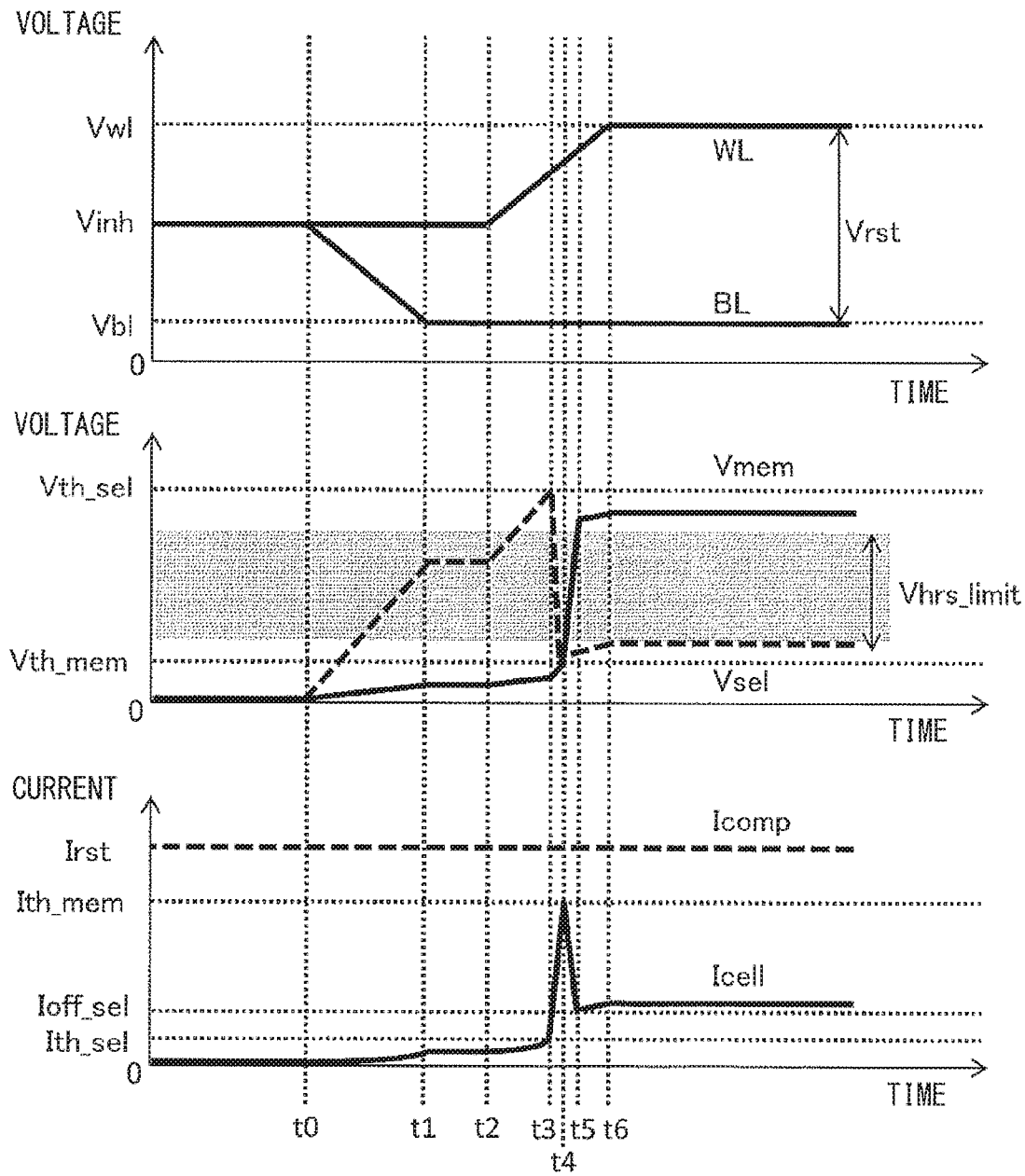
[ FIG. 10 ]

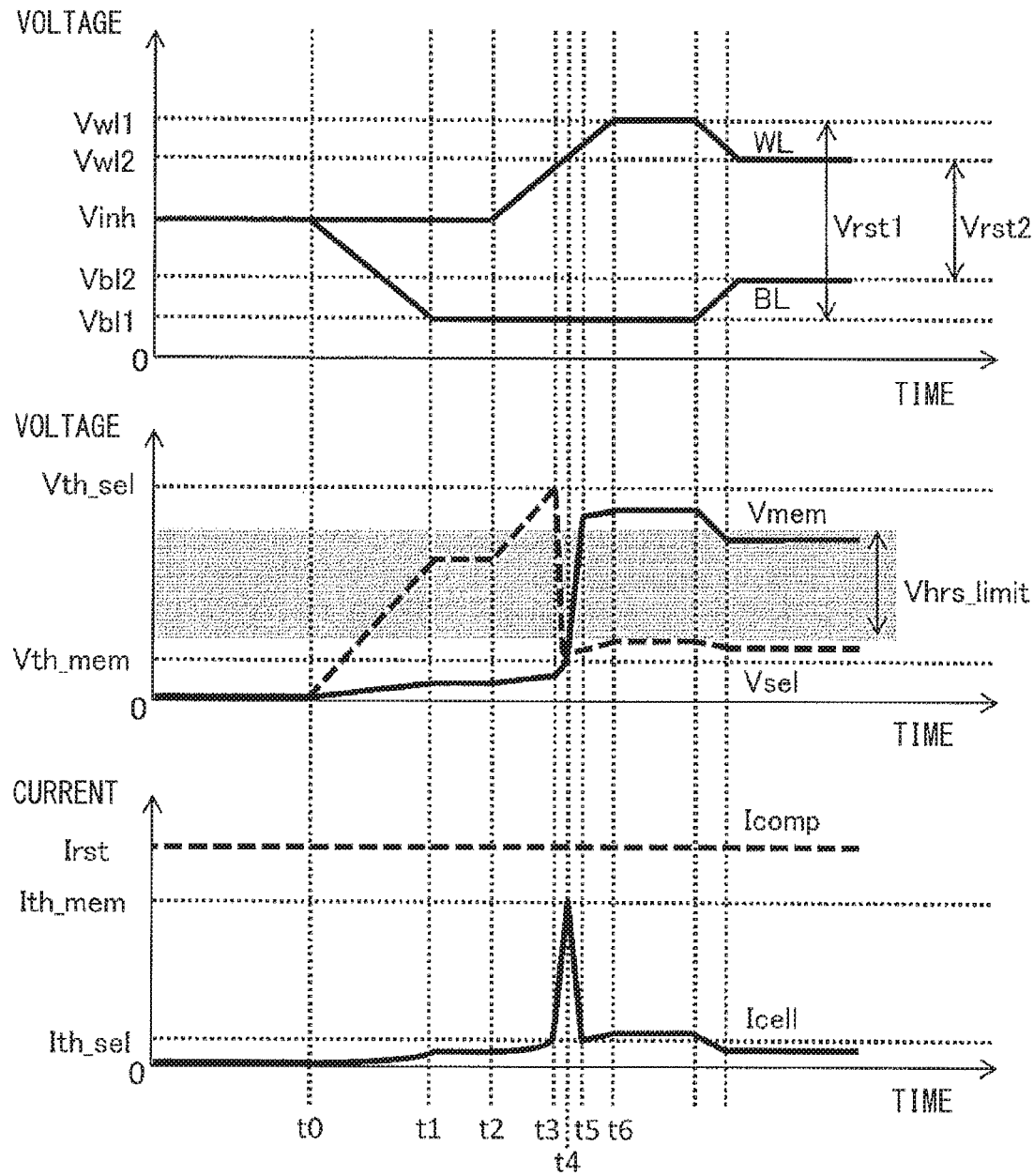
[FIG. 11]

[ FIG. 12 ]
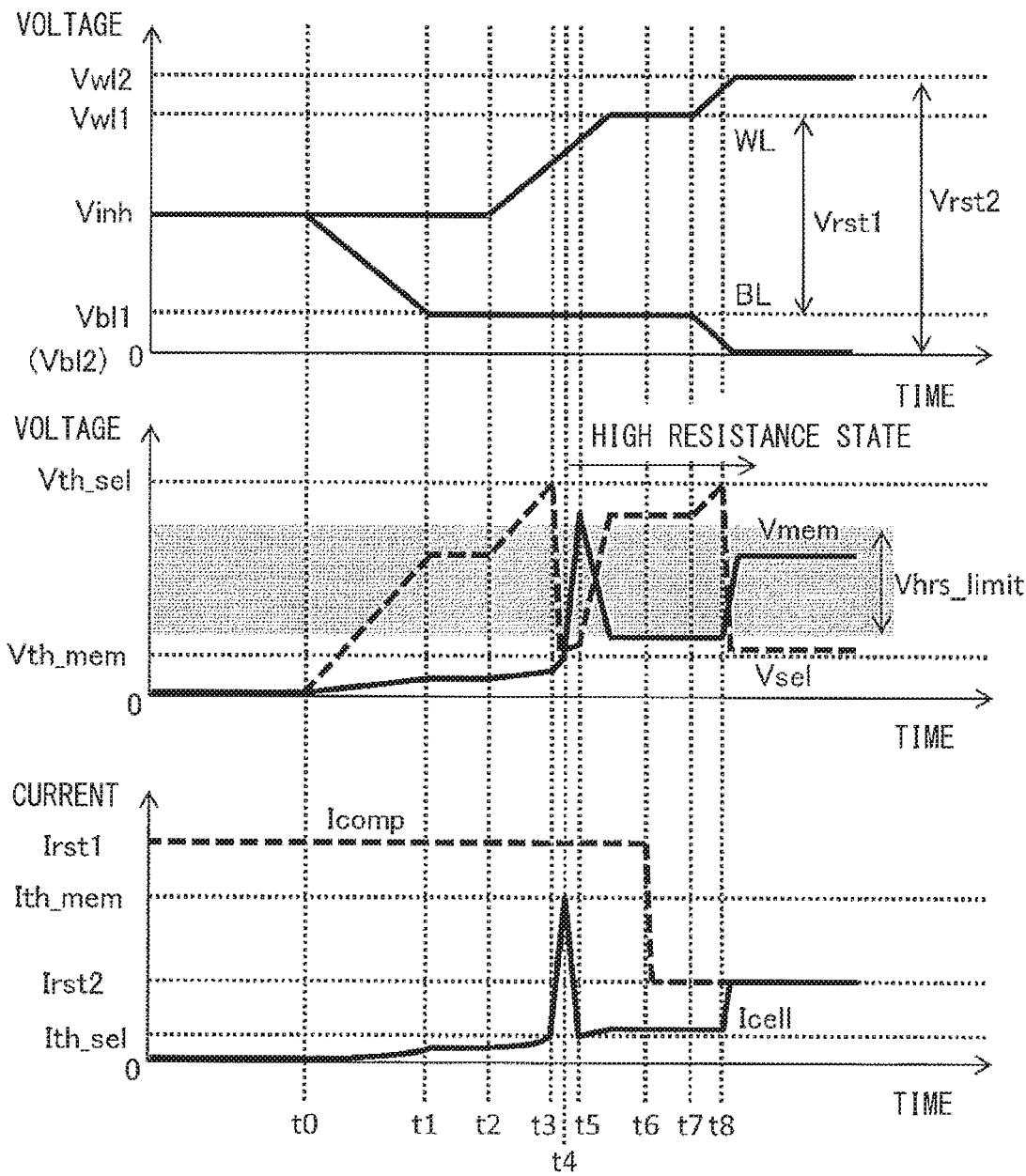

[ FIG. 13 ]
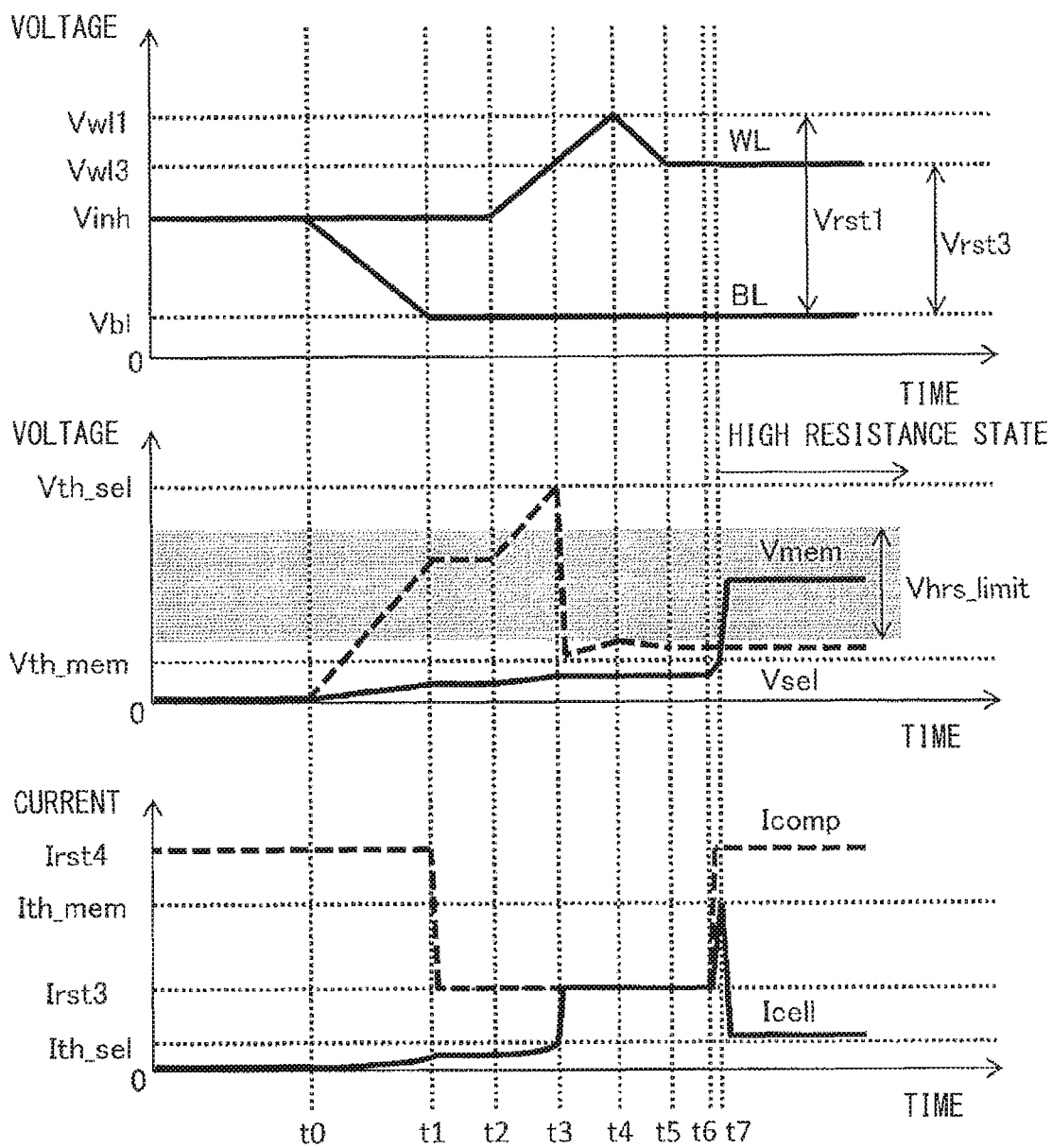

[ FIG. 14 ]
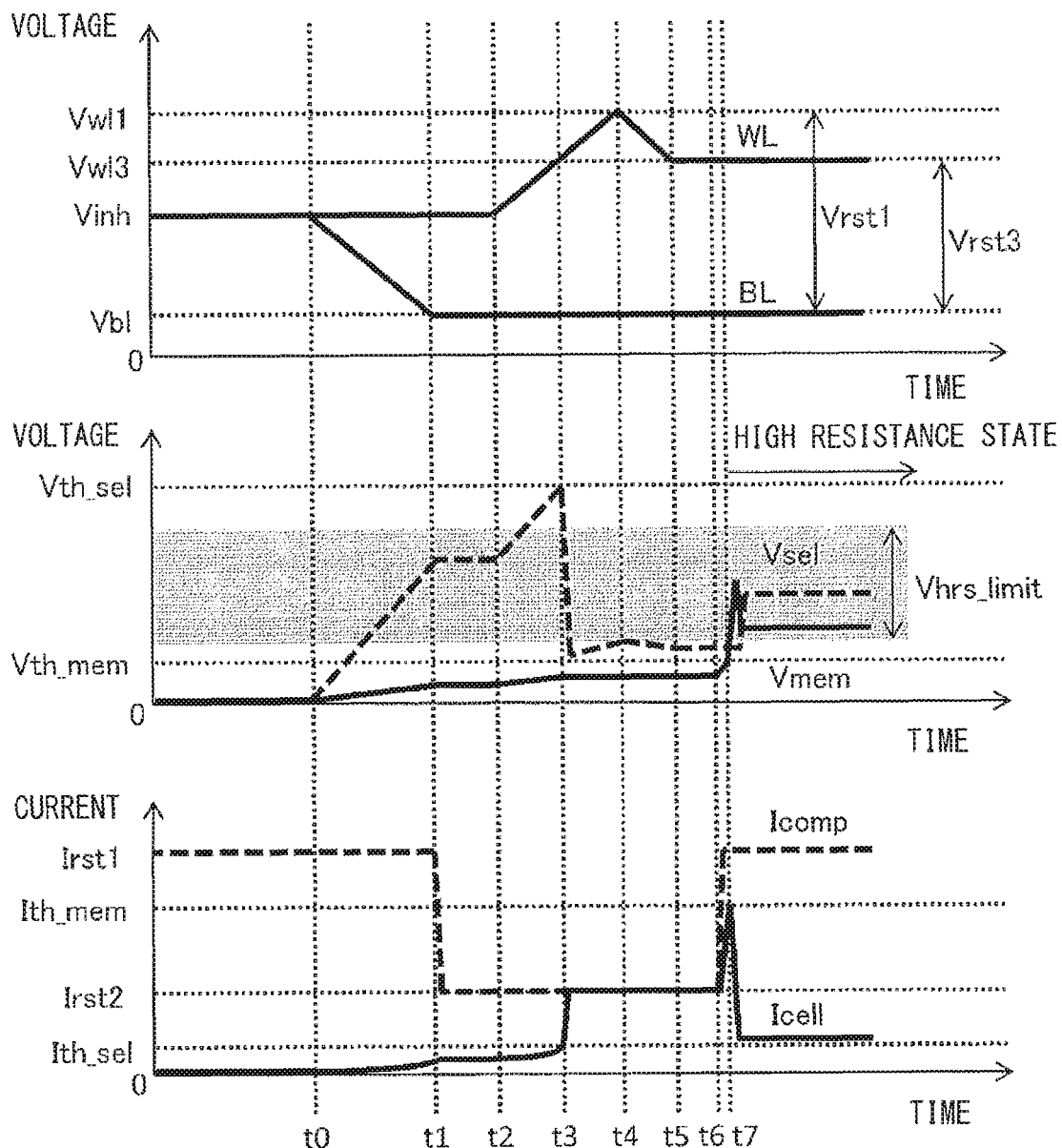

[ FIG. 15 ]
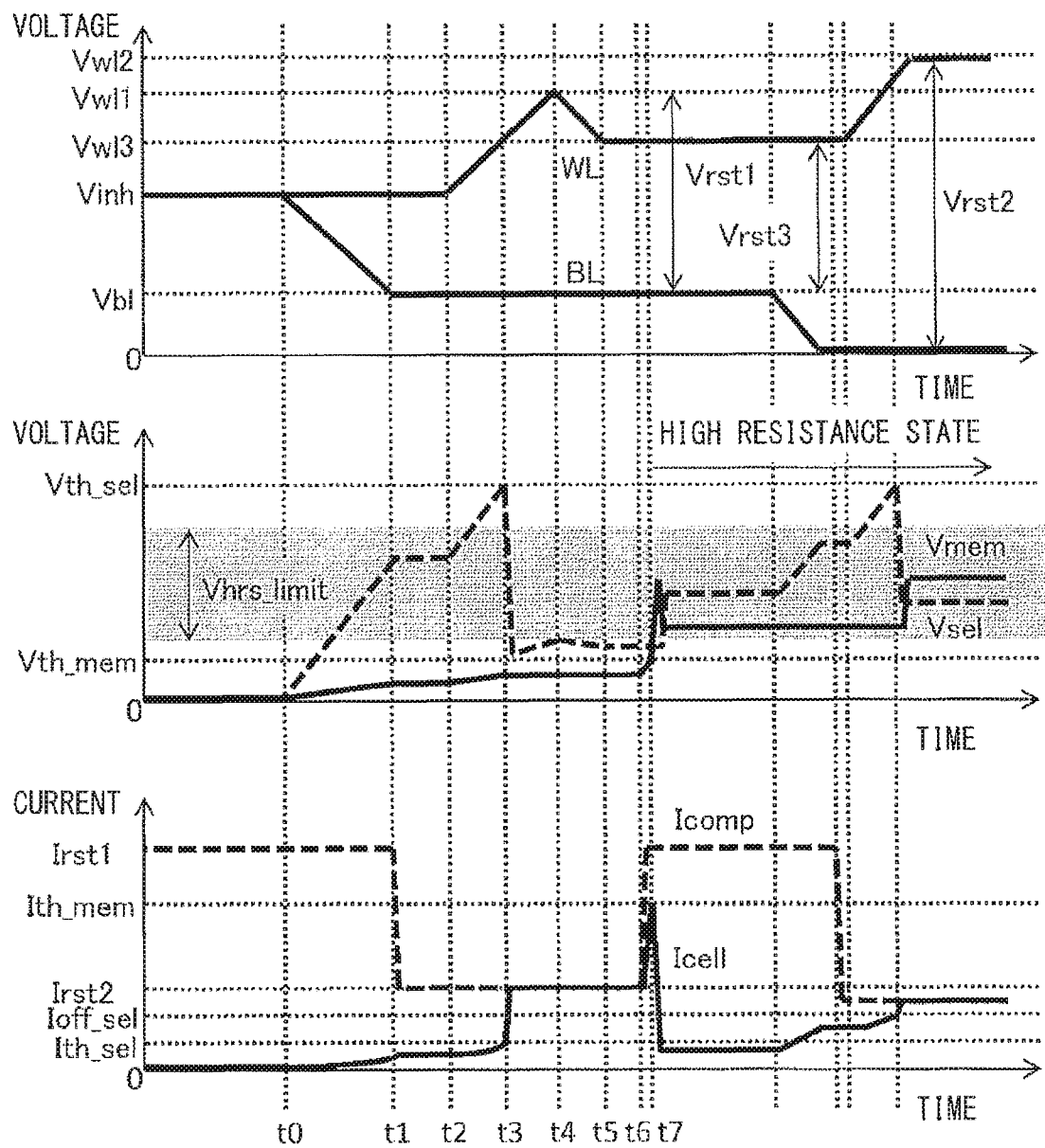

[ FIG. 16 ]
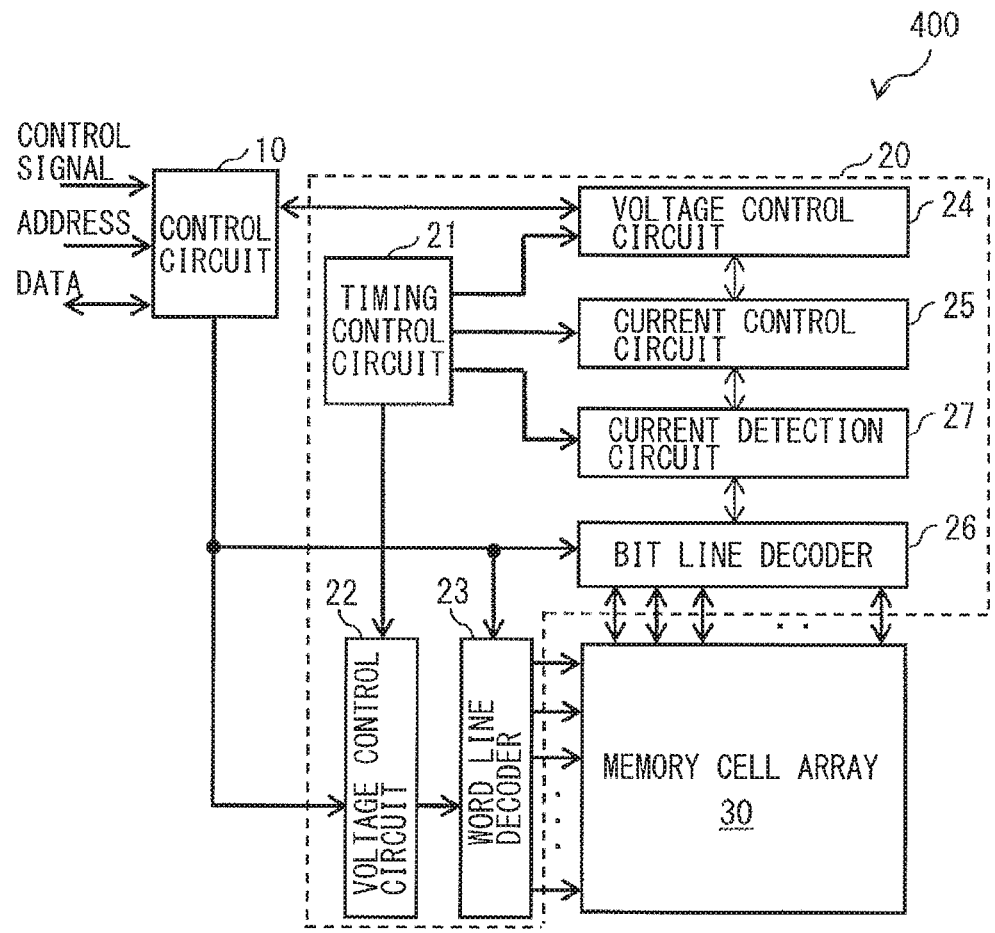
[ FIG. 17 ]
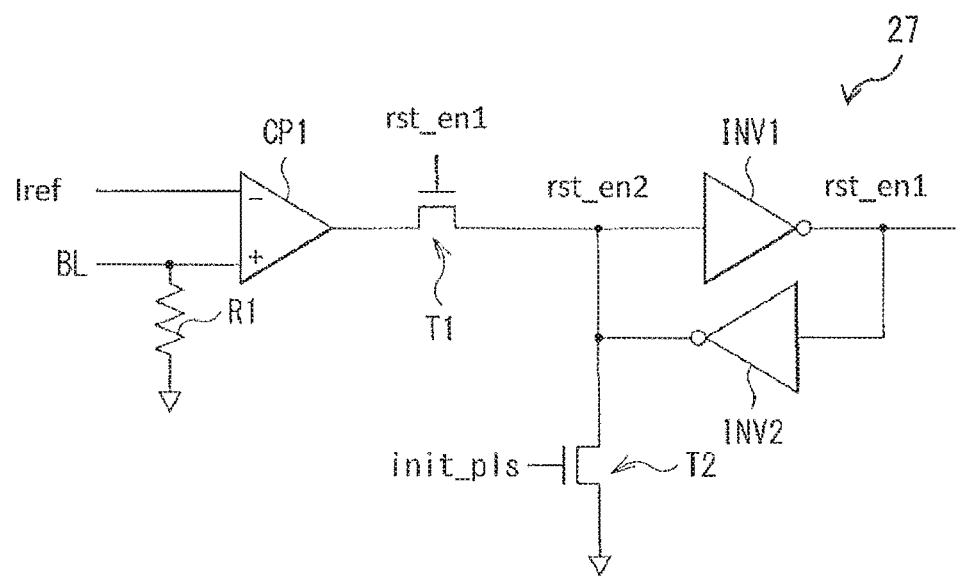

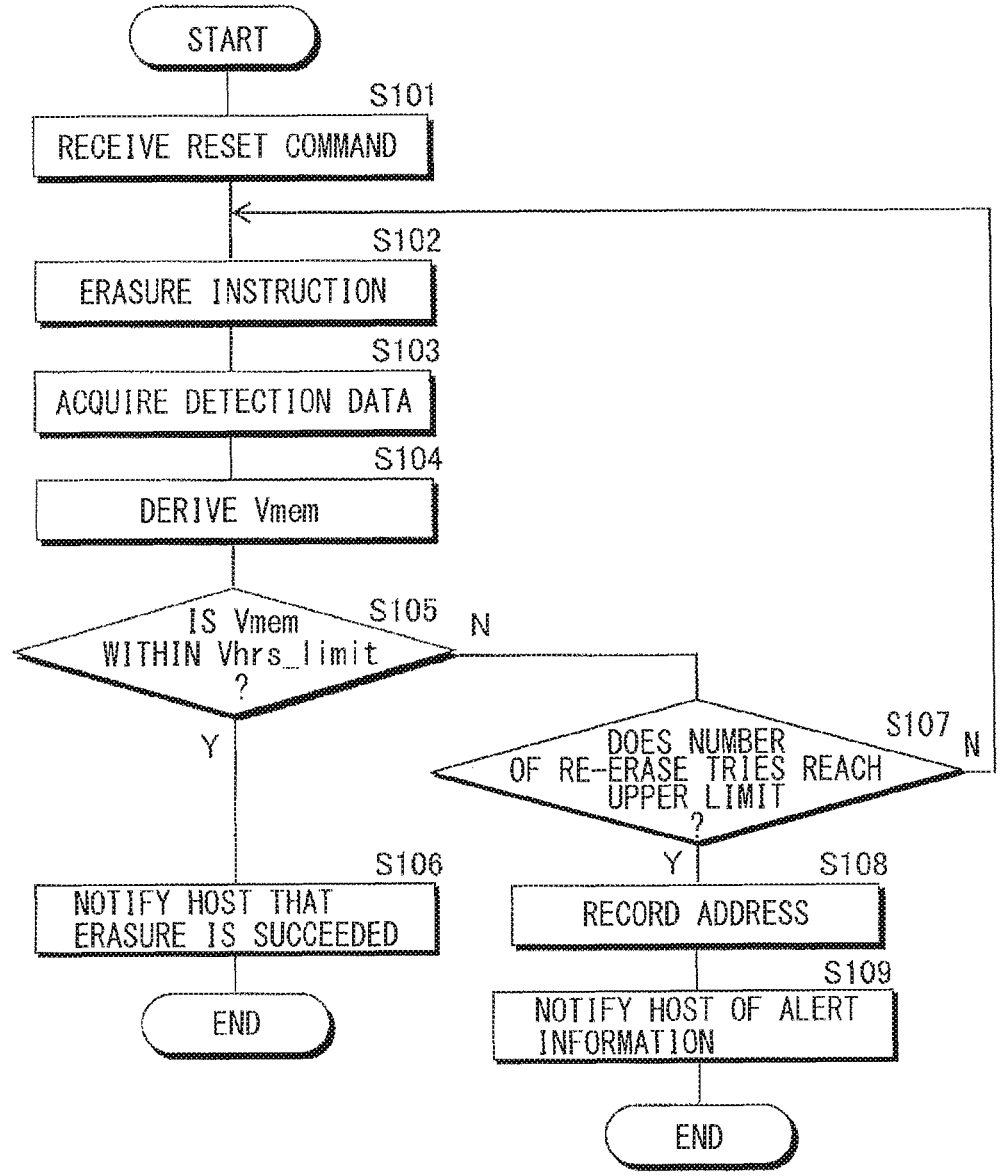
[ FIG. 18 ]

MEMORY APPARATUS AND METHOD OF CONTROLLING MEMORY APPARATUS

CROSS REFERENCE TO RELATED APPLICATIONS

This application is a U.S. National Phase of International Patent Application No. PCT/JP2018/018251 filed on May 11, 2018, which claims priority benefit of Japanese Patent Application No. JP 2017-099626 filed in the Japan Patent Office on May 19, 2017. Each of the above-referenced applications is hereby incorporated herein by reference in its entirety.

TECHNICAL FIELD

The disclosure relates to a memory apparatus and a method of controlling the memory apparatus.

BACKGROUND ART

As a nonvolatile memory, there are known a resistive random access memory (ReRAM), a conduction bridge random access memory (CBRAM), a phase-change random access memory (PCRAM), a magnetoresistive random access memory (MRAM), a spin transfer torque random access memory (STTRAM), and the like. In ReRAM, a variable resistor that stores data according to a change in resistance is used as a nonvolatile memory element (see, for example, PTL 1 and PTL 2).

As a configuration of a memory cell using the nonvolatile memory, a 1R (1 Resistor) type and a 1D1R (1 Diode 1 Resistor) type are known. A cross-point type memory apparatus is known in which such memory cells are disposed at intersections of a plurality of bit lines and a plurality of word lines.

CITATION LIST

Patent Literature

PTL 1: Japanese Unexamined Patent Application Publication No. 2011-243265
PTL 2: International Publication No. WO 2016/072173

SUMMARY OF THE INVENTION

In a cross-point type memory apparatus in which a variable resistor is used for a memory cell, data writing is performed by, for example, applying a voltage necessary for the writing to the memory cell, to change the variable resistor from a high resistance state to a low resistance state. The data writing is referred to as a "set". Data erasing is performed by, for example, applying a voltage necessary for the erasing to the memory cell, to change the variable resistor from a low resistance state to a high resistance state. The data erasing is referred to as a "reset".

In the reset memory cell, retention characteristics and a lifetime greatly differ depending on a magnitude of the applied voltage. For example, in a case where the voltage applied to the memory cell is lower than an appropriate range, the retention characteristics are deteriorated. Further, for example, in a case where the memory cell voltage exceeds the appropriate range, the rewriting lifetime is reduced due to repeated stress of writing and erasing. Therefore, it is desirable to provide a memory apparatus and a method of controlling the memory apparatus capable of suppressing deterioration in retention characteristics and reduction in a rewriting lifetime of the reset memory cell.

A memory apparatus according to an embodiment of the disclosure includes a memory cell disposed at an intersection of a first wiring line and a second wiring line. The memory cell includes a variable resistor whose resistance state changes to a first resistance state and a second resistance state, and a selector. The memory device further includes a drive circuit that writes data to the memory cell by changing the variable resistor from the first state to the second state, and erase data stored in the memory cell by changing the variable resistor from the second state to the first state. When erasing the data, the drive circuit changes in a stepwise manner a voltage applied to the memory cell, and changes in a stepwise manner a current limit value that limits a magnitude of a current flowing through the memory cell.

The method of controlling the memory apparatus according to an embodiment of the disclosure includes performing, by a drive circuit, the following two operations on a memory cell disposed at an intersection of a first wiring line and a second wiring line. Here, the memory cell includes a variable resistor whose resistance state changes to a first resistance state and a second resistance state, and a selector.
(1) Writing data in the memory cell by changing the variable resistor from a first state to a second state.
(2) Erasing data stored in the memory cell by changing the variable resistor from the second state to the first state.

In this control method, when erasing data, a voltage applied to the memory cell is changed in a stepwise manner, and a current limit value that limits the magnitude of the current flowing through the memory cell is changed in a stepwise manner.

According to the memory apparatus and the method of controlling the memory apparatus of an embodiment of the disclosure, when erasing data, the voltage applied to the memory cell is changed in a stepwise manner, and the current limit value that limits the amount of current flowing into the memory cell is also changed in a stepwise manner. Thus, it is possible to keep the voltage applied to the variable resistor when data erasing is completed within an appropriate voltage range.

According to the memory apparatus and the method of controlling the memory apparatus of an embodiment of the disclosure, it is possible to keep the voltage applied to the variable resistor when data erasing is completed within an appropriate voltage range. Thus, it is possible to suppress the deterioration in the retention characteristics and the reduction in the rewriting lifetime of the reset memory cell. It is to be noted that the effects of the technology are not necessarily limited to the effects described here, and may include any of the effects described herein.

BRIEF DESCRIPTION OF DRAWINGS

FIG. 1 is a circuit diagram illustrating a first example of a variable resistance memory device including a variable resistor as a nonvolatile memory element.
FIG. 2 is a circuit diagram illustrating a second example of a variable resistance memory device including a variable resistor as a nonvolatile memory element.
FIG. 3 is a diagram illustrating an example of functional blocks of an information processing system according to a first embodiment of the disclosure.
FIG. 4 is a diagram illustrating an example of functional blocks of a memory cell array unit of FIG. 3.

FIG. 5 is a diagram illustrating an example of a circuit configuration of the memory cell array of FIG. 3.

FIG. 6 is a diagram illustrating an example of a circuit configuration of a voltage control circuit of FIG. 3.

FIG. 7 is a diagram illustrating an example of the circuit configuration of the voltage control circuit of FIG. 3.

FIG. 8 is a diagram illustrating an example of a circuit configuration of a current control circuit of FIG. 3.

FIG. 9 is a timing chart illustrating an example of a reset operation in a memory cell according to Comparative Example 1.

FIG. 10 is a timing chart illustrating an example of a reset operation in a memory cell according to Comparative Example 2.

FIG. 11 is a timing chart illustrating an example of a reset operation in a memory cell according to Comparative Example 3.

FIG. 12 is a timing chart illustrating an example of a reset operation in a memory cell in the information processing system according to the present embodiment.

FIG. 13 is a timing chart illustrating an example of a reset operation in a memory cell in an information processing system according to a third embodiment of the disclosure.

FIG. 14 is a timing chart illustrating a modification example of the reset operation of FIG. 13.

FIG. 15 is a timing chart illustrating a modification example of the reset operation of FIG. 11.

FIG. 16 is a diagram illustrating a modification example of the functional blocks of the information processing system of FIG. 1.

FIG. 17 is a diagram illustrating an example of a circuit configuration of a current detection circuit of FIG. 16.

FIG. 18 is a flowchart illustrating an example of error processing performed in a memory apparatus of FIG. 16.

MODES FOR CARRYING OUT THE INVENTION

Hereinafter, embodiments of the disclosure is described in detail with reference to the drawings. The description is made in the following order.
0. Description of Resistance Variable Memory Device (FIGS. 1 and 2)
1. First Embodiment (FIGS. 3 to 12)
2. Second Embodiment (FIGS. 13 to 14)
3. Modification Example of Each Embodiment (FIG. 15)
4. Modification Example of Third Embodiment (FIGS. 16 to 18)

0. Description of Resistance Variable Memory Device

[Configuration]

FIG. 1 illustrates a first example of a variable resistance memory device including a variable resistor VR as a nonvolatile memory element. FIG. 2 illustrates a second example of the variable resistance memory device.

The variable resistance memory device illustrated in FIG. 1 has a 1T1R (1 Transistor 1 Resistor) type memory cell MC structure including a variable resistor VR and a three-terminal MOS (Metal Oxide Semiconductor) transistor TE. A gate terminal of the MOS transistor TE is coupled to a word line WL, a drain terminal is coupled to a bit line BL, and a source terminal is coupled to a source line SL via the variable resistor VR. The bit line BL and the source line SL respectively have a wiring resistance $R_{BL}$ and a wiring resistance $R_{SL}$. The bit line BL and the source line SL respectively have a parasitic capacitance $C_{BL}$ and a parasitic capacitance $C_{SL}$.

In a case where a memory cell array is formed using the 1T1R type variable resistance memory device, three wiring lines, i.e., the bit line BL, the word line WL, and the source line SL, are necessary. This makes it difficult to dispose memory cells MC at high density, although the high-density disposition of memory cells MC is an advantage of a cross-point type memory apparatus. In the 1T1R type, a current value of the memory cell MC is controllable by the word line WL. As a result, it is possible to suppress a voltage change between the bit line BL and the word line WL at a time of a resistance change of the variable resistor VR.

A variable resistance memory device illustrated in FIG. 2 has a 1S1R (1 Selector 1 Resistor) type memory cell MC in which a variable resistor VR and a selector SE are coupled in series. In FIG. 2, a 1D1R (1 Diode 1 Resistor) type memory cell MC including diode as the selector SE is illustrated as a 1S1R type memory cell MC.

The memory cell MC of the 1D1R type is disposed at each of intersections of a plurality of bit lines BL and a plurality of word lines WL, thereby forming a cross-point type memory device. In such a cross-point type memory apparatus, the bit line BL is coupled to one end of the variable resistor VR, and the word line WL is coupled to one end of the selector SE. The bit line BL and the word line WL respectively have a wiring resistance $R_{BL}$ and a wiring resistance $R_{WL}$. The bit line BL and the word line WL respectively have a parasitic capacitance $C_{BL}$ and a parasitic capacitance $C_{WL}$.

In the variable resistance memory device, a resistance state of the variable resistor VR changes to a high resistance state and a low resistance state, and a stored data value is distinguishable between "0" as a high resistance state and "1" as a low resistance state, for example.

[Problems]

In a cross-point type memory apparatus, in order to realize a high-density memory cell array, a two-terminal selector SE is often used as the selector SE as in the 1D1R type, instead of the three-terminal MOS transistor TE. Therefore, the selector SE does not have a function for limiting the current.

In the variable resistance memory device, two kinds of voltages exist in an erase (reset) operation. Specifically, a first type of a voltage is a voltage for causing a current necessary for inverting a resistance state of the variable resistor VR in the low resistance state to flow. A second type of a voltage is a voltage Vhrs_limit in a certain range necessary for stabilizing characteristics of the high resistance state after the variable resistor VR changes to the high resistance state. The voltage Vhrs_limit corresponds to one specific example of an "appropriate voltage range" according to an embodiment of the disclosure. The voltage Vhrs_limit corresponds to a range sandwiched between a voltage value applied to the selector SE while an initial reset voltage Vrst1 to be described later is applied to the memory cell MC when erasing data, and a voltage value applied to the variable resistor VR while the initial reset voltage Vrst1 is applied to the memory cell MC when erasing data.

Depending on the magnitude of the variation in the selector SE, the voltage applied to the variable resistor VR may be lower than the voltage Vhrs_limit in the predetermined range by the selector SE being selected once. In this case, the resistance value of the variable resistor VR is lower than a desired value, and there is a possibility that the retention characteristics are deteriorated. Further, depending on the magnitude of the variation in the selector SE, the voltage applied to the variable resistor VR may be higher than the voltage Vhrs_limit in the predetermined range by the selector SE being selected twice. In this case, there is a possibility that the variable resistor VR be easily deteriorated and destroyed by repeated stress of writing and erasing, and the rewriting lifetime be reduced.

1. First Embodiment

[Configuration]

FIG. 3 illustrates an example of functional blocks of an information processing system according to a first embodiment of the disclosure. The information processing system includes a host computer 100 and a memory apparatus 200. The memory apparatus 200 includes a memory controller 300, one or a plurality of memory cell array units 400, and a power supply circuit 500. It is to be noted that FIG. 3 illustrates a state in which one memory cell array unit 400 is provided. The memory controller 300 corresponds to one specific example of a "determination unit" according to an embodiment of the disclosure.

[Host Computer 100]

The host computer 100 controls the memory apparatus 200. More specifically, the host computer 100 issues a command specifying a logical address of an access destination, and supplies the command and data to the memory apparatus 200. The host computer 100 also receives data outputted from the memory apparatus 200. Here, the command is for controlling the memory apparatus 200, and includes, for example, a write command for instructing data write processing, a read command for instructing data read processing, or a reset command for instructing data erase processing. The logical address is an address allocated for each region of the access unit when the host computer 100 accesses the memory apparatus 200 in the address space defined by the host computer 100. The region of the access unit is hereinafter referred to as a "sector".

[Memory Controller 300]

The memory controller 300 controls the one or plurality of memory cell array units 400. The memory controller 300 receives a write command specifying a logical address from the host computer 100. In addition, the memory controller 300 executes data write processing in accordance with the write command. In this writing processing, the logical address is converted into a physical address, and data is written in the physical address. Here, the physical address is an address allocated in the one or plurality of memory cell array units 400 for each access unit when the memory controller 300 accesses the one or plurality of memory cell array units 400. The unit in which the memory controller 300 accesses the one or plurality of memory cell array units 400 is the same as, for example, the sector. In this case, a physical address is assigned to each sector in the one or plurality of memory cell array units 400. Further, upon receiving a read command specifying a logical address, the memory controller 300 converts the logical address into a physical address and reads data from the physical address. Then, the memory controller 300 outputs the data that has been read to the host computer 100 as read data. In addition, the memory controller 300 receives a set command from the host computer 100 to designate a logical address, converting the logical address into a physical address, and erasing data written in the physical address. The unit of access by the memory controller 300 may be the same as or different from the unit of access by the host computer 100.

[Power Supply Circuit 500]

The power supply circuit 500 supplies a desired voltage to the one or plurality of memory cell array units 400. More specifically, the power supply circuit 500 supplies a set voltage used at a time of writing, a sense voltage used at a time of reading, and a reset voltage used at a time of erasing to a bit line decoder 26 to be described later. The reset voltage at this time includes, for example, an initial bit voltage Vbl1, a late bit voltage Vbl2, and a common voltage Vinh. Further, the power supply circuit 500 supplies a sense voltage and a reset voltage to a word line decoder 23 to be described later. The reset voltage at this time includes, for example, an initial word voltage Vwl1, a late word voltage Vwl2, and the like. The initial reset voltage Vrst1, which is the difference between the initial word voltage Vwl1 and the initial bit voltage Vbl1 (=initial word voltage Vwl1−initial bit voltage Vbl1), corresponds to one specific example of a "first voltage" according to an embodiment of the disclosure. The initial reset voltage Vrst1 is a voltage for setting the selector SE to the selected state while the variable resistor VR is in the low resistance state in a reset operation. A late reset voltage Vrst2, which is the difference between the late word voltage Vwl2 and the late bit voltage Vbl2 (=late word voltage Vwl2−late bit voltage Vbl2), corresponds to one specific example of a "second voltage" according to an embodiment of the disclosure. The late reset voltage Vrst2 is a voltage for setting the selector SE to the selected state while the variable resistor VR is in the high resistance state in the reset operation, and is higher than the initial reset voltage Vrst1.

[Memory Cell Array Unit 400]

Next, the memory cell array unit 400 is described. FIG. 4 illustrates an example of functional blocks of the memory cell array unit 400. The memory cell array unit 400 includes, for example, a semiconductor chip. The memory cell array unit 400 includes a control circuit 10, a drive circuit 20, and a memory cell array 30. The control circuit 10 exchanges commands, write data, read data, and the like with the memory controller 300. The control circuit 10 writes data to the memory cell array 30 in accordance with the write command, and reads data from the memory cell array 30 in accordance with the read command. In addition, the control circuit 10 erases data at a predetermined position in the memory cell array 30 in accordance with the reset command.

[Memory Cell Array 30]

FIG. 5 illustrates an example of a circuit configuration of the memory cell array 30. The memory cell array 30 has n sectors (where n is an integer greater than or equal to 2). Each sector has a plurality of memory cells MC, the number of which corresponding to a size of the sector. Further, a physical address is allocated to each sector.

The memory cell array 30 is a so-called cross-point type memory cell array, and specifically includes a plurality of word lines WL, a plurality of bit lines BL, and a plurality of memory cells MC. The memory cells MC are each disposed at a position where one of the word lines WL and one of the bit lines BL oppose each other. The word line WL corresponds to one specific example of a "first wiring line" according to an embodiment of the disclosure. The bit line BL corresponds to one specific example of a "second wiring line" according to an embodiment of the disclosure. FIG. 5 illustrates an exemplary configuration in which memory cells MC are disposed at intersections of three bit lines BL0, BL1, and BL2 and three word lines WL0, WL1, and WL2. The number of bit lines BL, the number of word lines WL, and the number of memory cells MC are not limited to the illustrated example.

In the memory cell array 30, data can be written to a memory cell MC specified by an address input from the outside. In addition, data stored in the memory cell MC specified by the address input can be read. The data value stored in the memory cell MC is identified by using a resistance state of the variable resistor VR. For example, the stored data value is distinguishable between "0" as a high resistance state and "1" as a low resistance state. The high resistance state corresponds to one specific example of a "first resistance state" according to an embodiment of the disclosure. The low resistance state corresponds to one specific example of a "second resistance state" according to an embodiment of the disclosure.

[Drive Circuit 20]

Next, the drive circuit 20 is described. When erasing data, the drive circuit 20 changes in a stepwise manner a voltage applied to the memory cell MC, and changes in a stepwise manner a current limit value limiting a magnitude of a current flowing through the memory cell MC. Specifically, when erasing data, the drive circuit 20 increases in a stepwise manner the voltage applied to the memory cell MC, and decreases in a stepwise manner the current limit value limiting the magnitude of the current flowing through the memory cell MC.

For example, as illustrated in FIG. 4, the drive circuit 20 includes a timing control circuit 21, a voltage control circuit 22, a word line decoder 23, a voltage control circuit 24, a current control circuit 25, and a bit line decoder 26.

The timing control circuit 21 outputs a signal for controlling a timing of changing an output voltage to the voltage control circuits 22 and 24. For example, the timing control circuit 21 sets the output voltage of the voltage control circuit 22 to the voltage Vwl1 by setting a first reset enable signal/rst_en1, to be described later, to high. For example, the timing control circuit 21 sets the output voltage of the voltage control circuit 22 to the voltage Vwl2 by setting a second reset enable signal/rst_en2, to be described later, to high. For example, the timing control circuit 21 sets the output voltage of the voltage control circuit 24 to the voltage Vbl1 by setting a third reset enable signal/rst_en3, to be described later, to high. For example, the timing control circuit 21 sets the output voltage of the voltage control circuit 24 to the voltage Vbl2 by setting a fourth reset enable signal/rst_en4, to be described later, to high.

The timing control circuit 21 further outputs a signal for controlling a timing of changing a current limit value to the current control circuit 25. For example, the timing control circuit 21 sets the current limit value of the current control circuit 25 to a constant current (initial reset current Irst1) by setting a fifth reset enable signal/rst_en5 (to be described later) to high. For example, the timing control circuit 21 sets the current limit value of the current control circuit 25 to the constant current Irst2 (late reset current Irst2) by setting a sixth reset enable signal/rst_en6 (to be described later) to high.

The voltage control circuit 22 includes a circuit for driving the word line WL to which the data "1" is written, to a predetermined voltage (set voltage) necessary for the set operation, when performing the operation of writing the data "1", that is, when performing the write (set) operation of causing the variable resistor VR of the memory cell MC to change from the high resistance state to the low resistance state. In other words, the voltage control circuit 22 writes data into the memory cell MC by causing the variable resistor VR to change from the high resistance state to the low resistance state. The voltage control circuit 22 further includes a circuit for driving the word line WL to which the data "0" is written, to a predetermined voltage (reset voltage) necessary for the reset operation, when performing the operation of writing the data "0", that is, when performing the write (reset) operation of causing the variable resistor VR of the memory cell MC to change from the low resistance state to the high resistance state. In other words, the voltage control circuit 22 erases data stored in the memory cell MC by causing the variable resistor VR to change from the low resistance state to the high resistance state.

The voltage control circuit 22 controls the voltage (initial word voltage Vwl1) applied to the word line WL to cause the initial reset voltage Vrst1 to be a predetermined voltage when erasing the data "1". The voltage control circuit 22 further controls the voltage (late word voltage Vwl2) applied to the word line WL to cause the late reset voltage Vrst2 to be a predetermined voltage when erasing the data "1". When erasing data, the voltage control circuit 22 applies the initial reset voltage Vrst1 to the memory cell MC to cause the selector SE to be in the selected state while the variable resistor VR is in the low resistance state. After applying the initial reset voltage Vrst1 to the memory cell MC, the voltage control circuit 22 applies the late reset voltage Vrst2 (> initial reset voltage Vrst1) to the memory cell MC to cause the selector SE to be in the selected state while the variable resistor VR is in the high resistance state. After applying the initial word voltage Vwl1 to the word line WL, the voltage control circuit 22 subsequently applies the word voltage Vwl2 to the word line WL.

FIG. 6 illustrates an example of a circuit configuration of the voltage control circuit 22. The voltage control circuit 22 has a function of switching a voltage applied to the word line WL. The voltage control circuit 22 includes, for example, PMOS transistors T1 and T2, a NMOS transistor T3, and an AND circuit A1. A gate terminal of the transistor T3 is coupled to an output terminal of the AND circuit A1.

In the voltage control circuit 22, when the first reset enable signal/rst_en1 is high, the transistor T1 is turned on, and a voltage of the word line WL (or the decoder line WL_dec coupled to the word line WL) is set to the initial word voltage Vwl1. When the second reset enable signal/rst_en2 is high, the transistor T2 is turned on, and a voltage of the word line WL is set to the late word voltage Vwl2. The first reset enable signal/rst_en1 and the second reset enable signal/rst_en2 are not allowed to be high at the same time. In a case where the first reset enable signal/rst_en1 and the second reset enable signal/rst_en2 are low at the same time, the AND circuit A1 outputs high, the transistor T3 is turned on, and the transistors T1 and T2 are turned off. In this case, the word line WL is not selected, and the voltage of the word line WL is the common voltage Vinh.

The word line decoder 23 is coupled to each word line WL of the memory cell array 30, and selects a corresponding word line WL in accordance with a row address inputted from the address line. The word line WL selected by the word line decoder 23 is referred to as a selected word line, and all the word lines WL not selected by the word line decoder 23 are each referred to as a non-selected word line.

The voltage control circuit 24 includes a circuit for driving the bit line BL to which the data "1" is written, to a predetermined voltage (set voltage) necessary for the set operation, when performing the operation of writing the data "1", that is, when performing the write (set) operation of causing the variable resistor VR of the memory cell MC to change from the high resistance state to the low resistance state. The voltage control circuit 24 further includes a circuit for driving the bit line BL to which the data "0" is written, to a predetermined voltage (reset voltage) necessary for the reset operation, when performing the operation of writing the data "0", that is, when performing the write (reset) operation of causing the variable resistor VR of the memory cell MC to change from the low resistance state to the high resistance state.

The voltage control circuit 24 controls the voltage (initial bit voltage Vbl1) applied to the bit line BL to cause the initial reset voltage Vrst1 to be a predetermined voltage when erasing the data "1". The voltage control circuit 24 further controls the voltage (late bit voltage Vbl2) applied to the bit line BL to cause the late reset voltage Vrst2 to be a predetermined voltage when erasing the data "1".

FIG. 7 illustrates an example of a circuit configuration of the voltage control circuit 24. The voltage control circuit 24 has a function of switching a voltage applied to the bit line BL. The voltage control circuit 24 includes, for example, PMOS transistors T4 and T5, an NMOS transistor T6, and an AND circuit A2. A gate terminal of the transistor T6 is coupled to an output terminal of the AND circuit A2.

In the voltage control circuit 24, when the third reset enable signal/rst_en3 is high, the transistor T4 is turned on, and a voltage of the bit line BL (or the decoder line BL_dec coupled to the bit line BL) is set to the initial bit voltage Vbl1. When the fourth reset enable signal/rst_en4 is high, the transistor T5 is turned on, and a voltage of the bit line WL is set to the late bit voltage Vbl2. The third reset enable signal/rst_en3 and the fourth reset enable signal/rst_en4 are not allowed to be high at the same time. In a case where the third reset enable signal/rst_en3 and the fourth reset enable signal/rst_en4 are low at the same time, the AND circuit A2 outputs high, the transistor T6 is turned on, and the transistors T4 and T5 are turned off. In this case, the bit line BL is not selected, and the voltage of the bit line BL is the common voltage Vinh.

The bit line decoder 26 is coupled to each bit line BL of the memory cell array 30, and selects a corresponding bit line BL in accordance with a column address inputted from the address line. The bit line BL selected by the bit line decoder 26 is referred to as a selected bit line, and all the word lines WL not selected by the bit line decoder 26 are each referred to as a non-selected bit line.

The current control circuit 25 is a circuit for limiting the current flowing through the bit line BL to a predetermined limit current value. The current control circuit 25 sets the current limit value of the bit line BL to a current value (initial reset current Irst1) necessary for causing the variable resistor VR to change from the low resistance state to the high resistance state during a period (a period from t3 to t5 to be described later) in which the erase current flows in the memory cell MC by applying the initial reset voltage Vrst1 to the memory cell MC. The current control circuit 25 sets the current limit value of the bit line BL to the initial reset current Irst1 during a period (e.g., t0 to t6 to be described later) including, for example, t3 to t5 to be described later and not including a period (t8 to be described later) during which the late reset voltage Vrst2 is applied to the memory cell MC.

The current control circuit 25 further sets the current limit value of the bit line BL to a current value (late reset current Irst2) necessary for the value of the voltage applied to the variable resistor VR to be within an appropriate voltage range (voltage Vhrs_limit) during a period in which the late reset voltage Vrst2 is applied to the memory cell MC (after t8 to be described later). The current control circuit 25 sets the current limit value of the bit line BL to the late stage reset current Irst2, for example, during a period after t8 to be described later. The late reset current Irst2 is a value smaller than the initial reset current Irst1, and is a current value necessary to maintain the resistance value of the variable resistor VR at the time of erasing. The initial reset current Irst1 corresponds to one specific example of a "first current value" according to an embodiment of the disclosure. The late reset current Irst2 corresponds to one specific example of a "second current values" according to an embodiment of the disclosure.

FIG. 8 illustrates an example of a circuit configuration of the current control circuit 25. The current control circuit 25 includes, for example, NMOS transistors T9 and T10 whose gate terminals are coupled to each other, constant current sources I1 and I2, a transistor T7 coupled in series with the constant current source I1, and a transistor T8 coupled in series with the constant current source I2. The constant current source I1 supplies the initial reset current Irst1. The constant current source I2 supplies the late reset current Irst2.

The constant current source I1 is coupled to a source terminal of the transistor T10 via the transistor T7. The constant current source I2 is coupled to the source terminal of the transistor T10 via the transistor T8. That is, the constant current sources I1 and I2 are coupled in parallel with each other to the source terminal of the transistor T10 via the transistors T7 and T8. The gate terminal and the source terminal of the transistor T10 are electrically coupled to each other. The source of the transistor T9 is coupled to a bit line BL (for example, a decoder line BL-dec coupled to the bit line BL; that is, the current control circuit 25 includes a current mirror circuit.

In a case where the transistor T9 operates in a saturation region, the current control circuit 25 supplies the initial reset current Irst1 or the initial reset current Irst2 to the bit line BL as a compliance current Icomp that is to be a predetermined limiting current. When the fifth reset enable signal/rst_en5 is high, the transistor T7 is turned on, and the current control circuit 25 supplies the initial reset current Irst1 to the bit line BL (or the decoder line BL_dec coupled to the bit line BL) as the compliance current Icomp. At this time, the current control circuit 25 limits the upper limit value (current limit value) of the current flowing through the bit line BL to the initial reset current Irst1. When the sixth reset enable signal/rst_en6 is high, the transistor T8 is turned on, and the current control circuit 25 supplies the late reset current Irst2 to the bit line BL (or the decoder line BL_dec coupled to the bit line BL) as the compliance current Icomp. At this time, the current control circuit 25 limits the upper limit value (current limit value) of the current flowing through the bit line BL to the late reset current Irst2.

[Reset operation]

Next, an example of a reset operation according to Comparative Examples 1, 2, and 3 is described with reference to FIGS. 9, 10, and 11. In FIGS. 9, 10, and 11, the upper part illustrates voltage waveforms of the bit line BL and the word line WL with the horizontal axis indicating time and the vertical axis indicating voltage values; the middle part illustrates waveforms of voltages applied to the selector SE and the variable resistor VR with the horizontal axis indicating time and the vertical axis indicating voltage values; and the lower part illustrates a current waveform of the bit line BL with the horizontal axis indicating time and the vertical axis indicating current values.

The current control circuit 25 sets the current limit value of the bit line BL to the reset current Irst during the entire reset operation. The voltage control circuits 22 and 24 first drive all the bit lines BL and the word lines WL to the common voltage Vinh prior to the reset operation via the bit line decoder 26 and the word line decoder 23. When the reset operation is started, the voltage control circuit 24 drives the selected bit line to a predetermined voltage Vbl via the bit line decoder 26. Subsequently, the voltage control circuit 22 drives the selected word line to a predetermined voltage Vwl via the word line decoder 23. As a result, the reset voltage Vrst(=Vwl−Vbl) is applied to the memory cell MC.

When the voltage Vth_sel necessary for the changing to the selected state is applied to the selector SE in the non-selected state at time t3, the selector SE enters the selected state (low resistance state). At this time, since both the selector SE and the variable resistor VR are in the low resistance state, a current necessary for the variable resistor VR in the low resistance state to change to the high resistance state flows to the memory cell MC in the low resistance state at time t4. As a result, the variable resistor VR changes to a high resistance state. When the variable resistor VR changes to the high resistance state, the current flowing through the memory cell MC rapidly decreases.

At this time, the amount of decrease in the current flowing through the memory cell MC changes due to the variation in the resistance value of the selector SE. As a result, for example, as illustrated in FIG. 9, in a case where the current flowing through the memory cell MC decreases to a magnitude sufficient for the selector SE to change to the non-selected state (high resistance state), both the selector SE and the variable resistor VR enter the high resistance state at time t5. At this time, a voltage division ratio of the voltage applied to the selector SE and the variable resistor VR changes due to the variation in the resistance value of the selector SE. As a result, for example, as illustrated in FIG. 9, the selector SE changes to the high resistance state, and the variable resistor VR changes to the low resistance state. Further, for example, as illustrated in FIG. 10, in a case where the current flowing through the memory cell MC does not decrease to a magnitude sufficient for the selector SE to change to the non-selected state (high resistance state), the selector SE maintains to be in the low resistance state, and the variable resistor VR also maintains to be in the high resistance state.

Incidentally, as illustrated in FIG. 9, after the reset operation is completed, the voltage applied to the variable resistor VR may deviate from the appropriate voltage range (voltage Vhrs_limit). In this case, there is a possibility that the variable resistor VR is easily deteriorated and destroyed by repeated stress of writing and erasing, and the rewriting lifetime is reduced. Further, as illustrated in FIG. 10, after the reset operation is completed, the voltage applied to the variable resistor VR may have a value close to the lower limit of the appropriate voltage range (voltage Vhrs_limit). In this case, the resistance value of the variable resistor VR is lower than a desired value, and there is a possibility that the retention characteristics are deteriorated.

As a method for preventing the deterioration of the rewriting lifetime, for example, the method illustrated in FIG. 11 may be used. Specifically, the voltage control circuits 22 and 24 drive the voltage of the selected word line to a voltage Vwl2, which is slightly smaller than the voltage Vwl (=Vwl1), after the reset operation is completed via the bit line decoder 26 and the word line decoder 23. At the same time, the voltage control circuit 22 and the word line decoder 23 drive the selected word line to a voltage Vdl2, which is slightly higher than the voltage Vbl (=Vbl1). Thus, a reset voltage Vrst2 (=Vwl2−Vbl2), which is slightly lower than the reset voltage Vrst (=Vrst1), is applied to the memory cell MC. As a result, it is possible to lower a voltage Vmem applied to the variable resistor VR which has been changed to the high resistance state by Vw1−Vw2, and to keep the voltage Vmem within the appropriate voltage range (voltage Vhrs_limit). Therefore, it is possible to suppress the reduction in the rewriting lifetime.

Next, an example of the reset operation according to the present embodiment is described with reference to FIG. 12. In FIG. 12, the upper part illustrates voltage waveforms of the bit line BL and the word line WL with the horizontal axis indicating time and the vertical axis indicating voltage values; the middle part illustrates waveforms of voltages applied to the selector SE and the variable resistor VR with the horizontal axis indicating time and the vertical axis indicating voltage values; and the lower part illustrates a current waveform of the bit line BL with the horizontal axis indicating time and the vertical axis indicating current values.

The current control circuit 25 sets the current limit value of the bit line BL to the initial reset current Irst1 during a time period from a time prior to the start of the reset operation to t6. The voltage control circuits 22 and 24 first drive all the bit lines BL and the word lines WL to the common voltage Vinh prior to the reset operation via the bit line decoder 26 and the word line decoder 23. When the reset operation is started, the voltage control circuit 24 drives the selected bit line to a predetermined voltage Vbl1 via the bit line decoder 26. Subsequently, the voltage control circuit 22 drives the selected word line to a predetermined voltage Vwl1 via the word line decoder 23. As a result, the reset voltage Vrst1 (=Vwl1−Vbl1) is applied to the memory cell MC.

When the voltage Vth_sel necessary for the changing to the selected state is applied to the selector SE in the non-selected state at time t3, the selector SE enters the selected state (low resistance state). At this time, since both the selector SE and the variable resistor VR are in the low resistance state, a current necessary for the variable resistor VR in the low resistance state to change to the high resistance state flows to the memory cell MC in the low resistance state at time t4. As a result, the variable resistor VR changes to a high resistance state. When the variable resistor VR changes to the high resistance state, the current flowing through the memory cell MC rapidly decreases.

At this time, the amount of decrease in the current flowing through the memory cell MC changes due to the variation in the resistance value of the selector SE. As a result, for example, as illustrated in FIG. 12, when the current flowing through the memory cell MC decreases to a magnitude sufficient for the selector SE to change to the non-selected state (high resistance state), both the selector SE and the variable resistor VR enter the high resistance state at time t5. At this time, the voltage division ratio of the voltage applied to the selector SE and the variable resistor VR changes due to the variation in the resistance value of the selector SE. As a result, for example, as illustrated in FIG. 12, the selector SE changes to the high resistance state, and the variable resistor VR changes to the low resistance state.

Subsequently, the current control circuit 25 sets the current limit value of the bit line BL to the late stage reset current Irst2, from a stage t6 prior to the application of the predetermined voltage Vbl2 (<Vbl1) to the selected bit line BL. The voltage control circuit 24 drives the selected bit line to the predetermined voltage Vbl2 via the bit line decoder 26. That is, the voltage control circuit 24 lowers the voltage to be applied to the selected bit line from the voltage Vbl1 to the voltage Vbl2. Further, for example, at the same time as the voltage applied to the selected bit line is lowered from the voltage Vbl1 to the voltage Vbl2, the voltage control circuit 22 drives the selected word line to the predetermined voltage Vwl2 (>Vwl1) via the word line decoder 23. That is, the voltage control circuit 22 raises the voltage applied to the selected word line from the voltage Vwl1 to the voltage Vwl2. As a result, a reset voltage Vrst2 (=Vwl2−Vbl2) having a value larger than the reset voltage Vrst1 is applied to the memory cell MC.

When the voltage Vth_sel necessary for the changing to the selected state is applied to the selector SE in the non-selected state (high resistance state) at time t8, the selector SE enters the selected state (low resistance state). As a result, a large current starts to flow in the memory cell MC. However, since the current limit value of the bit line BL is set to the late reset current Irst2 by the current control circuit 25, the upper limit value of the current flowing through the memory cell MC is limited to the late reset current Irst2. Further, at this time, since the variable resistor VR maintains to be in the high resistance state, the voltage Vmem applied to the variable resistor VR rapidly rises. However, since the upper limit value of the current flowing through the memory cell MC is limited to the late reset current Irst2, the voltage applied to the variable resistor VR is limited to a value obtained by multiplying the late reset current Irst2 by the resistance value of the variable resistor VR. As a result, the voltage to be applied to the variable resistor VR has a voltage value within the appropriate voltage range (voltage Vhrs_limit) and slightly smaller than the upper limit value of the appropriate voltage range (voltage Vhrs_limit).

[Effects]

Next, effects of the memory apparatus 200 of the present embodiment are described.

In the present embodiment, when erasing data, the voltage applied to the memory cell MC is changed in a stepwise manner, and the current limit value for limiting the magnitude of the current flowing through the memory cell MC is changed in a stepwise manner. More specifically, when erasing data, the voltage applied to the memory cell MC increases in a stepwise manner, and the current limit value for limiting the magnitude of the current flowing through the memory cell MC decreases in a stepwise manner. Thus, it is possible to keep the voltage applied to the variable resistor VR when data erasing is completed within the appropriate voltage range (voltage Vhrs_limit). As a result, it is possible to suppress the deterioration in the retention characteristics and the reduction in the rewriting lifetime of the reset memory cell MC.

In the present embodiment, when erasing data, after the initial reset voltage Vrst1 is applied to the memory cell MC, the late reset voltage Vrst2 having a value larger than the initial reset voltage Vrst1 is applied to the memory cell MC. Thus, it is possible to keep the voltage applied to the variable resistor VR when data erasing is completed within the appropriate voltage range (voltage Vhrs_limit). As a result, it is possible to suppress the deterioration in the retention characteristics and the reduction in the rewriting lifetime of the reset memory cell MC.

Further, in the present embodiment, the current limit value is set to the current value (Irst1) necessary for causing the variable resistor VR to change from the low resistance state to the high resistance state during the period (t3 to t5) in which the erase current flows through the memory cell MC by applying the initial reset voltage Vrst1 to the memory cell MC. In addition, the current limit value is set to the current value (Irst2) necessary for the value of the voltage applied to the variable resistor VR to be within the appropriate voltage range (voltage Vhrs_limit) during the period (t6 and later) in which the late reset voltage Vrst2 is applied to the memory cell MC. Thus, it is possible to keep the voltage applied to the variable resistor VR when data erasing is completed within the appropriate voltage range (voltage Vhrs_limit). As a result, it is possible to suppress the deterioration in the retention characteristics and the reduction in the rewriting lifetime of the reset memory cell MC.

Further, in the present embodiment, the voltage Vhrs_limit corresponds to a range sandwiched between a voltage value applied to the selector SE while the initial reset voltage Vrst1 is applied to the memory cell MC when erasing data, and a voltage value applied to the variable resistor VR while the initial reset voltage Vrst1 is applied to the memory cell MC when erasing data. Thus, the voltage applied to the variable resistor VR when data erasing is completed is kept within the appropriate voltage range (voltage Vhrs_limit), thereby suppressing the deterioration in the retention characteristics and the reduction in the rewriting lifetime of the reset memory cell MC.

2. Second Embodiment

FIG. 13 illustrates an example of a reset operation in an information processing system according to a second embodiment of the disclosure. In the present embodiment, when erasing data, the drive circuit 20 applies an initial reset voltage Vrst1 to the memory cell MC to cause the selector SE to be in the selected state while the variable resistor VR is in the low resistance state, and then applies a late reset voltage Vrst3 lower than the initial reset voltage Vrst1 to the memory cell MC. The late reset voltage Vrst3 corresponds to one specific example of a "third voltage" according to an embodiment of the disclosure.

The current control circuit 25 sets the current limit value of the bit line BL to a current value (initial reset current Irst3) necessary for the variable resistor VR to be maintained in the low resistance state at a time point (t3 to be described later) when the selector SE changes from the non-selected state to the selected state, by applying the initial reset voltage Vrst1 to the memory cell MC. The current control circuit 25 sets the current limit value to a current value (late reset current Irst4) (> initial reset current Irst3) necessary for the value of the voltage applied to the variable resistor VR to be within the appropriate voltage range (voltage Vhrs_limit) during a period in which the late reset voltage Vrst4 is applied to the memory cell MC (after t6 to be described later). The initial reset current Irst3 corresponds to one specific example of a "third current value" according to an embodiment of the disclosure. The late reset current Irst4 corresponds to one specific example of a "fourth current value" according to an embodiment of the disclosure.

In the present embodiment, the appropriate voltage range (voltage Vhrs_limit) corresponds to a range sandwiched between a voltage value applied to the selector SE while the initial reset voltage Vrst1 is applied to the memory cell MC without setting a current limit value when erasing data, and a voltage value applied to the variable resistor VR while the initial reset voltage Vrst1 is applied to the memory cell MC when erasing data.

Next, an example of the reset operation according to the present embodiment is described with reference to FIG. 13. In FIG. 13, the upper part illustrates voltage waveforms of the bit line BL and the word line WL with the horizontal axis indicating time and the vertical axis indicating voltage values; the middle part illustrates waveforms of voltages applied to the selector SE and the variable resistor VR with the horizontal axis indicating time and the vertical axis indicating voltage values; and the lower part illustrates a current waveform of the bit line BL with the horizontal axis indicating time and the vertical axis indicating current values.

The voltage control circuits 22 and 24 first drive all the bit lines BL and the word lines WL to the common voltage Vinh prior to the reset operation via the bit line decoder 26 and the word line decoder 23. When the reset operation is started, the voltage control circuit 24 drives the selected bit line to a predetermined bit voltage Vbl via the bit line decoder 26. Subsequently, the voltage control circuit 22 drives the selected word line to a predetermined voltage Vwl1 via the word line decoder 23. Thus, the reset voltage Vrst1 (=Vwl1−Vbl) is applied to the memory cell MC. The current control circuit 25 sets the current limit value of the bit line BL to the late stage reset current Irst4 during a period from before the reset operation is started to a time point (t1), the time point (t1) being before the driving of the predetermined voltage Vwl with respect to the selected word line is started (t2). The current control circuit 25 further sets the current limit value of the bit line BL to the initial reset current Irst3 during a period from t1 to time t6, the time t6 being after time t5 at which the late reset voltage Vrst3 is applied to the memory cell MC.

When the voltage Vth_sel necessary for the changing to the selected state is applied to the selector SE in the non-selected state at time t3, the selector SE enters the selected state (low resistance state). At this time, since both the selector SE and the variable resistor VR are in the low resistance state, the amount of current flowing through the memory cell MC in the low resistance state starts to increase. However, since the upper limit value of the current flowing through the memory cell MC is limited to the initial reset current Irst3, the variable resistor VR is not applied with a voltage of a value higher than or equal to the voltage Vth_mem necessary for the variable resistor VR to change to the high resistance state. As a result, the variable resistor VR maintains to be in a low resistance state.

Subsequently, the voltage control circuit 22 drives the selected word line to a predetermined voltage Vwl3 (Vinh<Vwl3<Vwl1) via the word line decoder 23. That is, the voltage control circuit 22 reduces the voltage applied to the selected word line from the voltage Vw1 to the voltage Vw3. At this time, the voltage Vwl3 is set within a range in which the selected state of the selector SE can be maintained. Thereafter, the current control circuit 25 sets the current limit value of the bit line BL to the late reset current Irst4 from t6. In this way, since the upper limit value of the current flowing through the memory cell MC widens from the initial reset current Irst3 to the late reset current Irst4, the amount of current flowing through the variable resistor VR starts to increase, and a voltage having a value higher than or equal to a current Ith_mem is applied, the current Ith_mem being the current necessary for the variable resistor VR to change to the high resistance state. Thus, the variable resistor VR changes from the low resistance state to the high resistance state, and the voltage Vmem applied to the variable resistor VR rapidly rises. At this time, since the voltage of the variable resistor VR rises from the low resistance state, the voltage Vmem of the variable resistor VR does not exceed the appropriate voltage range (voltage Vhrs_limit). As a result, the voltage applied to the variable resistor VR has a voltage value within the appropriate voltage range (voltage Vhrs_limit) and slightly smaller than the upper limit value of the appropriate voltage range (voltage Vhrs_limit).

[Effects]

Next, effects of the memory apparatus 200 according to the present embodiment are described.

In the present embodiment, when erasing data, the voltage applied to the memory cell MC is changed in a stepwise manner, and the current limit value for limiting the magnitude of the current flowing through the memory cell MC is changed in a stepwise manner. Specifically, when erasing data, after the initial reset voltage Vrst1 is applied to the memory cell MC to cause the selector SE to be in the selected state while the variable resistor VR is in the low resistance state, the late reset voltage Vrst3 lower than the initial reset voltage Vrst1 is applied to the memory cell MC. Further, the current limit value of the bit line BL is set to the current value (initial reset current Irst3) necessary for the variable resistor VR to be maintained in the low resistance state at the time point (t3 to be described later) when the selector SE changes from the non-selected state to the selected state by applying the initial reset voltage Vrst1 to the memory cell MC. Further, the current limit value is set to a current value (late reset current Irst4) (> initial reset current Irst3) necessary for the value of the voltage applied to the variable resistor VR to be a value within the appropriate voltage range (voltage Vhrs_limit) during a period in which the late reset voltage Vrst3 is applied to the memory cell MC (after t6 to be described later). Thus, it is possible to keep the voltage applied to the variable resistor VR when data erasing is completed within the appropriate voltage range (voltage Vhrs_limit). As a result, it is possible to suppress the deterioration in the retention characteristics and the reduction in the rewriting lifetime of the reset memory cell MC.

Further, in the present embodiment, the voltage Vhrs_limit corresponds to a range sandwiched between a voltage value applied to the selector SE while the initial reset voltage Vrst1 is applied to the memory cell MC without setting a current limit value when erasing data, and a voltage value applied to the variable resistor VR while the initial reset voltage Vrst1 is applied to the memory cell MC when erasing data. Thus, the voltage applied to the variable resistor VR when data erasing is completed is kept within the appropriate voltage range (voltage Vhrs_limit), thereby suppressing the deterioration in the retention characteristics and the reduction in the rewriting lifetime of the reset memory cell MC.

It is to be noted that, as illustrated in FIG. 14, the value of the voltage Vse1 applied to the selector SE and the value of the voltage Vmem applied to the variable resistor VR may be reversed due to the variation in the selector SE. Even in such a case, it is possible to keep the voltage applied to the variable resistor VR when data erasing is completed within the appropriate voltage range (voltage Vhrs_limit). As a result, it is possible to suppress the deterioration in the retention characteristics and the reduction in the rewriting lifetime of the reset memory cell MC.

Further, as illustrated in FIG. 15, after applying the bit voltage Vbl to the selected bit line, the voltage control circuit 24 may apply a voltage lower than the bit voltage Vbl, for example, a ground voltage, to the selected bit line. Furthermore, after applying the late reset voltage Vrst3 to the selected word line, the voltage control circuit 22 may apply the late reset voltage Vrst2 having a value greater than the late reset voltage Vrst3 and the initial setup voltage Vrst1 to the selected word line. This makes it possible to keep the voltage applied to the variable resistor VR when data erasing is completed within the appropriate voltage range (Vhrs_limit). As a result, it is possible to suppress the deterioration in the retention characteristics and the reduction in the rewriting lifetime of the reset memory cell MC.

3. Modification Example Common to Each Embodiment

FIG. 16 illustrates a modification example of functional blocks of the memory cell array unit 400 included in the information processing system according to each of the above embodiments. A memory cell array unit 400 according to the present modification example corresponds to the memory cell array unit 400 according to each embodiment described above further including a current detection circuit 27.

The current detection circuit 27 detects a current flowing through the memory cell MC. The detection result (detection data) of the current detection circuit 27 is transmitted to the memory controller 300. As illustrated in FIG. 17, for example, the current detection circuit 27 includes inverters INV1 and INV2, a comparator CP1, NMOS transistors T1 and T2, and a current detection resistor R1.

A bit line BL coupled to the current detection resistor R1 is coupled to a non-inverting input terminal (+) of the comparator CP1. A reference current Iref is inputted to an inverting input terminal (−) of the comparator CP1. The comparator CP1 outputs high as a detection signal where the current value of the bit line BL is larger than the reference current Iref, and outputs low as a detection signal where the current value of the bit line BL is smaller than the reference current Iref.

In a case where the reset operation is started, an initialization pulse int_pls is applied to the gate of the transistor T2 in advance to initialize a latch including the inverters INV1 and INV2. When the latch is initialized, an output reset_en1 is high and an output reset_en2 is low.

The transistor T1 couples the current detection circuit and the latch when the latch is initialized, and when the current detection circuit outputs high as a detection signal, the output reset_en1 is low, thereby turning off the coupling between the current detection circuit and the latch. By doing so, an increase in the current of the bit line BL is detected only once during one reset operation.

Next, error processing in the memory apparatus according to the present modification example is described. FIG. 18 is a flowchart illustrating an example of error processing in the memory apparatus according to the present modification example.

First, the memory controller 300 receives a reset command that specifies a logical address from the host computer 100 (step S101). When receiving a set command from the host computer 100, the memory controller 300 translates the logical address into a physical address, and instructs the memory cell array unit 400 to erase data written at the physical address (step S102). Upon receiving the instruction from the memory controller 300 to erase data, the memory cell array unit 400 performs the erasing of data at the specified address. At this time, the memory cell array unit 400 acquires a detection result (detection data) of a current flowing through the memory cell MC on which the erasing has been performed from the current detection circuit 27 (step S103).

The memory controller 300 multiplies the obtained detection result (detection data) by a resistance value of the variable resistor VR to derive the voltage Vmem to be applied to the variable resistor VR included in the memory cell MC subjected to erasing (step S104). Here, the resistance value of the variable resistor VR is, for example, a value calculated from statistical data of resistance values in the vicinity of a relatively high voltage necessary for state stabilization after the resetting. The memory controller 300 determines whether or not the voltage Vmem obtained by the derivation is within the appropriate voltage range (voltage Vhrs_limit) (step S105). As a result, in a case where the voltage Vmem is within the appropriate voltage range (voltage Vhrs_limit), the memory controller 300 notifies the host computer 100 that the reset operation has been appropriately completed (erase succeeded) (step S106).

Alternatively, in a case where the voltage Vmem is outside the appropriate voltage range (voltage Vhrs_limit), the memory controller 300 counts the number of times the data erase is instructed to the specified address, and determines whether or not the count number (number of re-erase tries) exceeds a predetermined upper limit (step S107). As a result, in a case where the number of re-erase tries does not exceed the predetermined upper limit, the memory controller 300 executes the step S102. That is, the memory controller 300 re-erases the data at the specified address. Alternatively, in a case where the number of re-erase tries exceeds the predetermined upper limit, the memory controller 300 records the specified address and notifies the host computer 100 of the recorded address as the alert (steps S108 and S109).

In the present modification example, it is determined whether or not the memory cell MC in which erasing has been performed has a defect on the basis of the detection result (detection data) obtained by the current detection circuit 27 in the memory cell array unit 400. In this way, in a case where there is a defect in the memory cell MC in which erasing has been performed, it is possible to immediately assign an alternative memory cell MC to the memory cell MC. As a result, the memory cell array unit 400 can be effectively utilized.

Although the disclosure is described hereinabove with reference to the example embodiments and modification examples, these embodiments and modification examples are not to be construed as limiting the scope of the disclosure and may be modified in a wide variety of ways. It should be appreciated that the effects described herein are mere examples. Effects of an example embodiment and modification examples of the disclosure are not limited to those described herein. The disclosure may further include any effects other than those described herein.

Moreover, the disclosure may have the following configurations.

(1)

A memory apparatus including:

a memory cell disposed at an intersection of a first wiring line and a second wiring line, and including a variable resistor and a selector, the variable resistor having a resistance state that changes to a first resistance state and a second resistance state; and a drive circuit that writes data to the memory cell by changing the variable resistor from the first resistance state to the second resistance state, and erases the data stored in the memory cell by changing the variable resistor from the second resistance state to the first resistance state, when erasing the data, the drive circuit changing in a stepwise manner a voltage applied to the memory cell, and changing in a stepwise manner a current limit value that limits a magnitude of a current flowing through the memory cell.

(2)

The memory apparatus according to (1), in which, when erasing the data, the drive circuit increases in a stepwise manner the voltage applied to the memory cell, and decreases in a stepwise manner the current limit value that limits the magnitude of the current flowing through the memory cell.

(3) The memory apparatus according to (2), in which, when erasing the data, the drive circuit applies a first voltage to the memory cell, and then applies a second voltage (> the first voltage) to the memory cell, the first voltage causing the selector to be in a selected state while the variable resistor is in the second resistance state, the second voltage causing the selector to be in the selected state while the variable resistor is in the first resistance state.

(4) The memory apparatus according to (3), in which the drive circuit sets the current limit value to a first current value necessary for changing the variable resistor from the second resistance state to the first resistance state in a period in which an erase current flows in the memory cell by applying the first voltage to the memory cell, and sets the current limit value to a second current value (< the first current value) necessary for a value of a voltage applied to the variable resistor to be within an appropriate voltage range in a period in which the second voltage is applied to the memory cell.

(5) The memory apparatus according to (4), in which the appropriate voltage range corresponds to a range sandwiched between a value of a voltage applied to the selector while the first voltage is applied to the memory cell when erasing the data and a value of a voltage applied to the variable resistor while the first voltage is applied to the memory cell when erasing the data.

(6) The memory apparatus according to (1), in which, when erasing the data, the drive circuit applies a first voltage to the memory cell, and then applies a third voltage to the memory cell, the first voltage being a voltage causing the selector to be in a selected state while the variable resistor is in the second resistance state, the third voltage being lower than the first voltage.

(7) The memory apparatus according to (6), in which the drive circuit sets the current limit value to a third current value necessary for the variable resistor to maintain to be in the second resistance state at a time point in which the selector changes from a non-selected state to the selected state by applying the first voltage to the memory cell, and sets the current limit value to a fourth current value (> the third current value) necessary for a value of a voltage applied to the variable resistor to be within an appropriate voltage range during a time period in which the third voltage is applied to the memory cell.

(8) The memory apparatus according to (7), in which the appropriate voltage range corresponds to a range sandwiched between a value of a voltage applied to the selector while the first voltage is applied to the memory cell without setting the current limit value when erasing the data and a value of a voltage applied to the variable resistor while the first voltage is applied to the memory cell when erasing the data.

(9) The memory apparatus according to (5) or (8), further including:
a current detection circuit that detects a current flowing through the memory cell; and a determination unit that multiplies a current value obtained from a result detected in the current detection circuit by a resistance value of the memory cell to derive the value of the voltage to be applied to the variable resistor, and determining whether or not the obtained voltage value is within the appropriate voltage range.

(10) A method of controlling a memory apparatus performed by a drive circuit, the method including:
writing data to a memory cell by changing a variable resistor from a first resistance state to a second resistance state; and
when erasing the data, changing in a stepwise manner a voltage applied to the memory cell and changing in a stepwise manner a current limit value that limits a magnitude of a current flowing through the memory cell,
when erasing the data, the voltage applied to the memory cell being increased in a stepwise manner, and the current limit value that limits the magnitude of the current flowing through the memory cell being decreased in a stepwise manner.

This application claims the benefit of Japanese Priority Patent Application JP2017-099626 filed with the Japan Patent Office on May 19, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A memory apparatus, comprising:
a memory cell at an intersection of a first wiring line and a second wiring line, wherein
the memory cell includes a variable resistor and a selector, and
the variable resistor has a resistance state that changes to a first resistance state and a second resistance state; and
a drive circuit configured to:
write data to the memory cell based on change of the resistance state of the variable resistor from the first resistance state to the second resistance state;
erase the data in the memory cell based on change of the resistance state of the variable resistor from the second resistance state to the first resistance state;
change, at a time of the erase of the data, a voltage to the memory cell from a first voltage to a second voltage in a stepwise manner; and
change, at the time of the erase of the data, a current limit value from a first current value to a second current value in the stepwise manner, wherein
the current limit value limits a magnitude of a current through the memory cell;
a value of a voltage to the variable resistor is within a specific voltage range based on the current limit value that is the second current value, and
the current limit value is changed to the second current value in a period in which the voltage of the memory cell is the second voltage.

2. The memory apparatus according to claim 1, wherein, at the time of the erase of the data, the drive circuit is further configured to:
increase the voltage to the memory cell in the stepwise manner; and
decrease the current limit value in the stepwise manner.

3. The memory apparatus according to claim 2, wherein
at the time of the erase of the data, the drive circuit is
further configured to apply the first voltage to the
memory cell, and then apply the second voltage to the
memory cell,
the second voltage is larger than the first voltage,
the selector is in a selected state based on the voltage to
the memory cell is the first voltage and the variable
resistor is in the second resistance state, and
the selector is in the selected state based on the voltage to
the memory cell is the second voltage and the variable
resistor is in the first resistance state.

4. The memory apparatus according to claim 3, wherein
the drive circuit is further configured to:
set the current limit value to the first current value for the
change of the resistance state of the variable resistor
from the second resistance state to the first resistance
state, wherein
the current limit value is set to the first current value in
a period in which an erase current flows in the
memory cell, and
the current limit value is set to the first current value
based on the voltage of the memory cell is the first
voltage; and
set the current limit value to the second current value in
the period in which the voltage of the memory cell is
the second voltage, wherein the second current value is
less than the first current value.

5. The memory apparatus according to claim 4, wherein
the specific voltage range corresponds to a range between a
value of a voltage to the selector while the voltage to the
memory cell is the first voltage at the time of the erase of the
data and the value of the voltage to the variable resistor
while the first voltage to the memory cell is the first voltage
at the time of the erase of the data.

6. The memory apparatus according to claim 1, wherein
at the time of the erase of the data, the drive circuit is
further configured to apply the first voltage to the
memory cell, and then apply the second voltage to the
memory cell,
the selector is in a selected state based on the voltage to
the memory cell is the first voltage and the variable
resistor is in the second resistance state, and
the second voltage is lower than the first voltage.

7. The memory apparatus according to claim 6, wherein
the drive circuit is further configured to:
set the current limit value to the first current value to
maintain the resistance state of the variable resistor in
the second resistance state, wherein
the current limit value is set to the first current value at
a time point in which the selector changes from a
non-selected state to the selected state, and
the current limit value is set to the first current value
based on the voltage of the memory cell is the first
voltage; and
set the current limit value to the second current value in
the period in which the voltage of the memory cell is
the second voltage, wherein the second current value is
greater than the first current value.

8. The memory apparatus according to claim 7, wherein
the specific voltage range corresponds to a range between a
value of a voltage to the selector while the first voltage to the
memory cell is the first voltage at the time of the erase of the
data and the value of the voltage to the variable resistor
while the voltage to the memory cell is the first voltage at the
time of the erase of the data.

9. The memory apparatus according to claim 5, further
comprising:
a current detection circuit configured to detect the current
through the memory cell; and
a determination unit configured to:
multiply a value of the detected current by a resistance
value of the memory cell;
obtain the value of the voltage to the variable resistor;
and
determine that the obtained voltage value is within the
specific voltage range.

10. A method of controlling a memory apparatus, the
method comprising:
writing, by a drive circuit, data to a memory cell based on
change of a resistance state of a variable resistor from
a first resistance state to a second resistance state;
erasing, by the drive circuit, the data in the memory cell
based on change of the resistance state of the variable
resistor from the second resistance state to the first
resistance state;
changing, by the drive circuit, at a time of the erase of the
data, a voltage to the memory cell from a first voltage
to a second voltage in a stepwise manner; and
changing, by the drive circuit, at the time of the erase of
the data, a current limit value from a first current value
to a second current value in the stepwise manner,
wherein
the current limit value limits a magnitude of a current
flowing through the memory cell,
a value of a voltage to the variable resistor is within a
specific voltage range based on the current limit
value is the second current value,
the current limit value is changed to the second current
value in a period in which the voltage of the memory
cell is the second voltage,
the memory cell is at an intersection of a first wiring
line and a second wiring line,
the memory cell includes the variable resistor and a
selector, and
the variable resistor has the resistance state that
changes to the first resistance state and the second
resistance state.

\* \* \* \* \*